US009224595B2

(12) United States Patent
Kishino et al.

(10) Patent No.: US 9,224,595 B2
(45) Date of Patent: Dec. 29, 2015

(54) SEMICONDUCTOR OPTICAL ELEMENT ARRAY AND METHOD OF MANUFACTURING THE SAME

(75) Inventors: Katsumi Kishino, Tokyo (JP); Akihiko Kikuchi, Tokyo (JP); Hiroto Sekiguchi, Tokyo (JP)

(73) Assignee: SOPHIA SCHOOL CORPORATION, Tokyo (JP)

( * ) Notice: Subject to any disclaimer, the term of this patent is extended or adjusted under 35 U.S.C. 154(b) by 835 days.

(21) Appl. No.: 13/061,425

(22) PCT Filed: Aug. 27, 2009

(86) PCT No.: PCT/JP2009/004173
§ 371 (c)(1),
(2), (4) Date: Feb. 28, 2011

(87) PCT Pub. No.: WO2010/023921
PCT Pub. Date: Mar. 4, 2010

(65) Prior Publication Data
US 2011/0169025 A1     Jul. 14, 2011

(30) Foreign Application Priority Data

Sep. 1, 2008 (JP) ................................ 2008-224129
Sep. 1, 2008 (JP) ................................ 2008-224131

(51) Int. Cl.
*H01L 29/24* (2006.01)
*H01L 21/02* (2006.01)
(Continued)

(52) U.S. Cl.
CPC ............. *H01L 21/0254* (2013.01); *B82Y 20/00* (2013.01); *H01L 21/0242* (2013.01);
(Continued)

(58) Field of Classification Search
CPC ... H01L 27/15; H01L 27/153; H01L 29/0657; H01L 29/0665; H01L 29/0669; H01L 29/0676
See application file for complete search history.

(56) References Cited

U.S. PATENT DOCUMENTS 6,713,845 B2    3/2004   Hayashi et al.
6,818,465 B2 *  11/2004  Biwa et al. .................... 438/22
(Continued)

FOREIGN PATENT DOCUMENTS

EP      0 504 851 A2    9/1992
JP      2002-252421 A   9/2002
(Continued)

OTHER PUBLICATIONS

Office Action issued by Chinese Patent Office in Chinese Application No. 200980141161.X dated Aug. 26, 2013.
(Continued)

*Primary Examiner* — Matthew E Warren
(74) *Attorney, Agent, or Firm* — Sughrue Mion, PLLC

(57) ABSTRACT

The present invention provides a semiconductor optical element array including: a semiconductor substrate having a main surface in which a plurality of concave portions is formed; a mask pattern that is formed on the main surface of the semiconductor substrate and includes a plurality of opening portions provided immediately above the plurality of concave portions; a plurality of fine columnar crystals that is made of a group-III nitride semiconductor grown from the plurality of concave portions to the upper side of the mask pattern through the plurality of opening portions; an active layer that is grown on each of the plurality of fine columnar crystals; and a semiconductor layer covering each of the active layers.

21 Claims, 21 Drawing Sheets

(51) Int. Cl.

| | | |
|---|---|---|
| *H01L 27/15* | (2006.01) | |
| *H01L 29/06* | (2006.01) | |
| *B82Y 20/00* | (2011.01) | |
| *H01L 31/0352* | (2006.01) | |
| *H01L 31/075* | (2012.01) | |
| *H01L 33/18* | (2010.01) | |
| *H01L 33/24* | (2010.01) | |
| *H01S 5/02* | (2006.01) | |
| *H01S 5/10* | (2006.01) | |
| *H01S 5/183* | (2006.01) | |
| *H01S 5/32* | (2006.01) | |
| *H01S 5/323* | (2006.01) | |
| *H01S 5/40* | (2006.01) | |
| *H01S 5/42* | (2006.01) | |

(52) U.S. Cl.
CPC .... *H01L21/02458* (2013.01); *H01L 21/02603* (2013.01); *H01L 21/02639* (2013.01); *H01L 27/15* (2013.01); *H01L 27/153* (2013.01); *H01L 29/0657* (2013.01); *H01L 29/0665* (2013.01); *H01L 29/0669* (2013.01); *H01L 29/0676* (2013.01); *H01L 31/035227* (2013.01); *H01L 31/035281* (2013.01); *H01L 31/075* (2013.01); *H01L 33/18* (2013.01); *H01L 33/24* (2013.01); *H01S 5/0213* (2013.01); *H01S 5/1042* (2013.01); *H01S 5/183* (2013.01); *H01S 5/3203* (2013.01); *H01S 5/32341* (2013.01); *H01S 5/4025* (2013.01); *H01S 5/423* (2013.01); *Y02E 10/548* (2013.01)

(56) References Cited

U.S. PATENT DOCUMENTS

| | | | | |
|---|---|---|---|---|
| 6,936,851 | B2 * | 8/2005 | Wang | 257/79 |
| 6,994,751 | B2 | 2/2006 | Hata et al. | |
| 7,109,530 | B2 | 9/2006 | Hayashi et al. | |
| 7,179,667 | B2 | 2/2007 | Okagawa et al. | |
| 7,279,344 | B2 | 10/2007 | Hayashi et al. | |
| 7,355,208 | B2 | 4/2008 | Hata et al. | |
| 7,485,902 | B2 | 2/2009 | Inoue et al. | |
| 7,829,900 | B2 | 11/2010 | Hata et al. | |
| 8,557,622 | B2 * | 10/2013 | Lee et al. | 438/44 |
| 2002/0038870 | A1 | 4/2002 | Kunisato et al. | |
| 2004/0048409 | A1 | 3/2004 | Biwa et al. | |
| 2004/0240834 | A1 | 12/2004 | Katoh et al. | |
| 2005/0194598 | A1 | 9/2005 | Kim et al. | |
| 2007/0248132 | A1 | 10/2007 | Kikuchi et al. | |
| 2008/0014667 | A1 | 1/2008 | Hooper et al. | |
| 2008/0036038 | A1 | 2/2008 | Hersee et al. | |
| 2008/0248603 | A1 | 10/2008 | Kunisato et al. | |
| 2012/0211727 | A1 * | 8/2012 | Ohlsson et al. | 257/29 |

FOREIGN PATENT DOCUMENTS

| | | |
|---|---|---|
| JP | 2002-261394 A | 9/2002 |
| JP | 2003-282942 A | 10/2003 |
| JP | 2003-289942 A | 10/2003 |
| JP | 2006-270125 A | 10/2006 |
| JP | 2006-339534 A | 12/2006 |
| JP | 2007-027298 A | 2/2007 |
| JP | 2008-022014 A | 1/2008 |
| JP | 2008-034482 A | 2/2008 |
| JP | 2008-034483 A | 2/2008 |
| JP | 2008-108757 A | 5/2008 |
| JP | 2008-108924 A | 5/2008 |
| JP | 2008-135778 A | 6/2008 |
| JP | 2008-182275 A | 8/2008 |
| WO | 2006/025407 A1 | 3/2006 |

OTHER PUBLICATIONS

M. Yoshizawa, et al., "Growth of Self-Organized GaN Nanostructures on Al$_2$O$_3$ (0001) by RF-Radical Source Molecular Beam Epitaxy," Jpn. J. Appl. Phys., vol. 36, 1997, pp. L459-L462, Part 2, No. 4B, No. 15.

Hiroto Sekiguchi, et al., "Structural and optical properties of GaN nanocolumns grown on (0001) sapphire substrates by rf-plasma-assisted molecular-beam epitaxy," Journal of Crystal Growth 300, 2007, pp. 259-262.

Communication issued by the Japanese Patent Office in Japanese Application No. 2010-526554 dated Oct. 8, 2013.

Office Action dated Jul. 22, 2014, issued by the Japanese Patent Office in JP Patent Application No. 2013-132114.

Extended European Search Report dated Jan. 23, 2015, and issued by the European Patent Office in application No. 09809577.1.

* cited by examiner (A)            (B)

| SEM IMAGE | 405nm | 510nm |
| (A) | (B) | (C) |

| SEM IMAGE | 365nm | 435nm | 500nm |
| (A) | (B) | (C) | (D) |

(A)  (B)

SEMICONDUCTOR OPTICAL ELEMENT ARRAY AND METHOD OF MANUFACTURING THE SAME

CROSS REFERENCE TO RELATED APPLICATIONS

This application is a National Stage of International Application No. PCT/JP2009/004173 filed Aug. 27, 2009, claiming priority based on Japanese Patent Application No. 2008-224129 filed Sep. 1, 2008 and Japanese Patent Application No. 2008-224131 filed Sep. 1, 2008, the contents of all of which are incorporated herein by reference in their entirety.

TECHNICAL FIELD

The present invention relates to a semiconductor optical element array and a method of manufacturing the same.

BACKGROUND ART

In recent years, a group-III nitride semiconductor, such as gallium nitride (GaN), has drawn attention as a semiconductor material capable of achieving a semiconductor light emitting element, such as a light emitting diode or a laser diode that can output high-quality light with a short wavelength. The semiconductor light emitting element is manufactured by forming a laminated structure made of a group-III nitride semiconductor on a substrate using a crystal growth technique, such as a metal organic chemical vapor deposition (MOCVD) method or a molecular beam epitaxy (MBE) method.

A known crystal growth technique, such as MOCVD or MBE, has high controllability in the laminated direction when the laminated structure is formed. In order to form a structure along the in-plane direction of the substrate, it is necessary to process the laminated structure using a crystal processing technique. The crystal processing technique is roughly divided into a top-down type and a bottom-down type. The top-down type is a technique that processes a crystal to form a structure after crystal growth. The bottom-up type is a technique that processes a base substrate in advance before crystal growth and grows a crystal on the base substrate, thereby forming a structure simultaneous with the crystal growth. The top-down process has a problem in that a crystal is likely to be damaged by processing and particularly, when a microstructure is formed, the surface area of the microstructure increases. The bottom-up process can easily obtain both a microstructure and good crystal quality.

Patent Document 1 (Japanese Patent Application Laid-Open No. 2008-108924) discloses a method of forming nanometer-scaled fine columnar crystals (nanocolumns) on a substrate using the bottom-up process. In the method, a large number of island-shaped Fe particles are formed on a spinel substrate and GaN nanocolumns are grown from each Fe particle to the upper side of the substrate. For example, a method of forming the nanocolumns is disclosed in Non-patent Document 1 (M. Yoshizawa et al., Jpn. J. Appl. Phys., Vol. 36, No. 4B (1997) pp. L459-L462) or Non-patent Document 2 (H. Sekiguchi et al., Journal of Crystal Growth, 300 (2007) pp. 259-262) in addition to Patent Document 1.

RELATED DOCUMENT

Patent Document

Patent Document 1: Japanese Patent Application Laid-Open No. 2008-108924

Non-Patent Document

Non-patent Document 1: M. Yoshizawa, A. Kikuchi, M. Mori, N. Fujita and K. Kishino, "Growth of Self-Organized GaN Nanostructures on $Al_2O_3$ (0001) by RF-Radical Source Molecular Beam Epitaxy", Jpn. J. Appl. Phys., Vol. 36, No. 4B (1997) pp. L459-L462.

Non-patent Document 2: H. Sekiguchi, T. Nakazato, A. Kikuchi and K. Kishino, "Structural and optical properties of GaN nanocolumns grown on (0001) sapphire substrates by rf-plasma-assisted molecular-beam epitaxy", Journal of Crystal Growth, 300 (2007), pp. 259-262.

DISCLOSURE OF THE INVENTION

Each of the GaN nanocolumns formed by the method disclosed in Patent Document 1 has a light emitting structure including an n-type layer, a light emitting layer and a p-type layer. A semiconductor light emitting element is formed by an aggregate of the GaN nanocolumns.

However, since each of the GaN nanocolumns is formed using the Fe particles arranged in an island shape on the substrate as nuclei, a variation in the position and shape of the GaN nanocolumns is likely to occur and it is difficult to regularly arrange the GaN nanocolumns. The variation may cause a variation in the characteristics of the semiconductor light emitting element. For example, a variation in the emission wavelength of the GaN nanocolumn occurs, which makes it difficult to obtain a desired emission color.

In view of the above-mentioned problems, the invention provides a semiconductor optical element array having a structure capable of controlling the position and shape of fine columnar crystals formed on a substrate with high accuracy to control the emission wavelength or light absorption wavelength of the fine columnar crystals and a method of manufacturing the same.

The inventors focused attention on a process of forming a mask pattern having a plurality of opening portions on a substrate and selectively growing nanometer-order fine columnar crystals (referred to as "nanocolumns", "nanorods" or "nanopillars") made of a group-III nitride semiconductor from the opening portions, for the position control and shape control of the nanocolumns. The inventors thoroughly studied the process and found a technique capable of controlling the emission wavelength or light absorption wavelength of the nanocolumn, thereby achieving the invention.

According to the invention, there is provided a semiconductor optical element array including: a semiconductor substrate having a main surface in which a plurality of concave portions is formed; a mask pattern that is formed on the main surface of the semiconductor substrate and includes a plurality of opening portions provided immediately above the plurality of concave portions; a plurality of fine columnar crystals that is made of a group-III nitride semiconductor grown from the plurality of concave portions to an upper side of the mask pattern through the plurality of opening portions; an active layer or a light absorbing layer that is grown on each of the plurality of fine columnar crystals; and a semiconductor layer covering each of the active layers or the light absorbing layers.

The semiconductor optical element array according to the invention includes the plurality of fine columnar crystals that is made of a group-III nitride semiconductor grown from the concave portions of the semiconductor substrate to the upper side of the mask pattern through the opening portions of the mask pattern. According to this structure, it is possible to control the diameter of the nanocolumn and obtain a semiconductor optical element array with a desired emission wavelength or absorption wavelength.

In particular, the peak wavelength of light emitted may be determined such that it shifts to the long wavelength side as the diameter of each of the nanocolumns increases and it shifts to the long wavelength side as the diameter of each of the nanocolumns decreases.

The diameter of the nanocolumn may be equal to or more than 10 nm and equal to or less than 1000 nm.

According to the invention, there is provided a method of manufacturing a semiconductor optical element array. The method includes: forming a mask pattern having a plurality of opening portions on a semiconductor substrate; etching the semiconductor substrate using the mask pattern as an etching mask to form a plurality of concave portions in a main surface of the semiconductor substrate; growing a plurality of fine columnar crystals from the concave portions to an upper side of the mask pattern through the opening portions; growing an active layer or a light absorbing layer on the fine columnar crystals; and forming a semiconductor layer covering the active layer or the light absorbing layer.

According to the invention, it is possible to control the position of the fine columnar crystals formed on the semiconductor substrate by adjusting the position of the opening portions of the mask pattern. In addition, it is possible to control the diameter of the fine columnar crystal by adjusting the diameter of the concave portion immediately below each opening portion. In this way, it is possible to set the peak wavelength of light emitted from the active layer or the wavelength of light absorbed by the light absorbing layer to a desired value. Therefore, it is possible to provide a semiconductor optical element array having a structure capable of controlling the position and shape of fine columnar crystals formed on a substrate with high accuracy to control the emission wavelength or light absorption wavelength of the fine columnar crystals and a method of manufacturing the same.

BRIEF DESCRIPTION OF THE DRAWINGS

The above and other objects, advantages and features of the present invention will be more apparent from the following description of certain preferred embodiments taken in conjunction with the accompanying drawings.

DESCRIPTION OF EMBODIMENTS

Hereinafter, exemplary embodiments of the invention will be described with reference to the accompanying drawings.

First Embodiment

Figure 1:
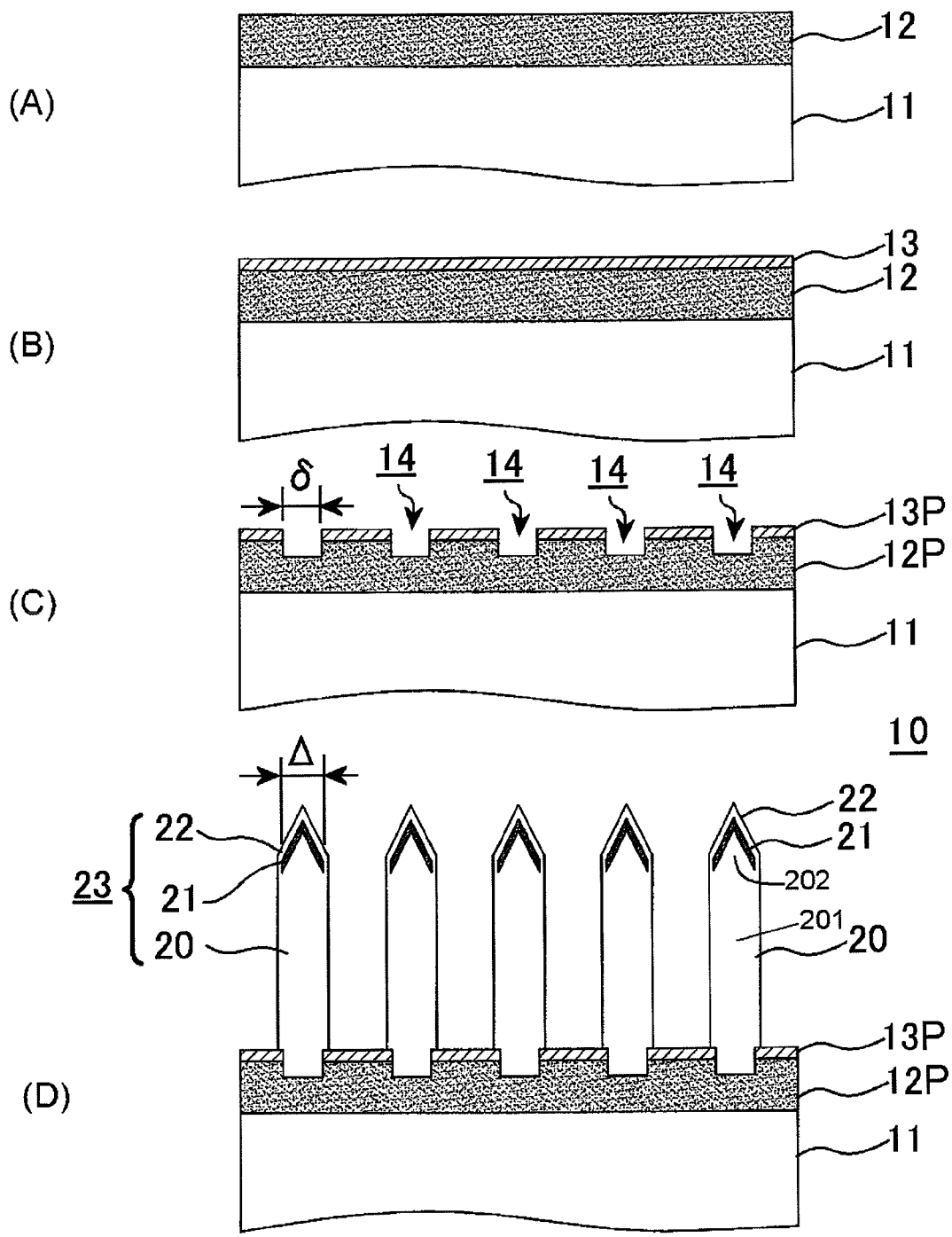
FIG. 1((A) to (D)) is cross-sectional views schematically illustrating a process of manufacturing a semiconductor element according to an embodiment of the invention.

FIGS. 1(A) to 1(D) are cross-sectional views schematically illustrating a process of manufacturing a semiconductor optical element array 10 according to an embodiment of the invention. FIG. 1(D) schematically shows the structure of the semiconductor optical element array 10 according to this embodiment.

As shown in FIG. 1(D), the semiconductor optical element array 10 includes a template substrate, a mask pattern 13P having a plurality of opening portions, and a plurality of nanocolumns 23. The template substrate is a semiconductor substrate obtained by epitaxially growing a group-III nitride semiconductor layer 12P on a base substrate 11, such as a sapphire substrate. For example, a gallium nitride or aluminum nitride buffer layer (not shown) is grown on the base substrate 11 by a low-temperature process using a metal-organic chemical vapor deposition (MOCVD) method or an MBE method and the group-III nitride semiconductor layer is grown on the buffer layer, thereby forming the template substrate.

A plurality of concave portions 14, . . . , 14 (FIG. 1(C)) is formed on the main surface of the group-III nitride semiconductor layer 12P.

The mask pattern 13P is formed on the main surface of the group-III nitride semiconductor layer 12P and has the opening portions (hereinafter, referred to as mask opening portions) immediately above the plurality of concave portions 14, . . . , 14. That is, the concave portions 14 are formed so as to overlap the opening portions and be exposed from the opening portions.

The semiconductor optical element array 10 includes a plurality of semiconductor elements (nanocolumns 23) each having a fine columnar crystal 20, an active layer 21 that is provided on the fine columnar crystal 20, and a semiconductor covering layer 22 that covers the active layer 21.

A plurality of fine columnar crystals 20, . . . , 20 is made of a group-III nitride semiconductor that is grown from the concave portions 14, . . . , 14 of the group-III nitride semiconductor layer 12P to the upper side of the mask pattern 13P through the mask opening portions. The active layer 21 is formed on the fine columnar crystal 20 and the semiconductor covering layer 22 is formed so as to cover the active layer 21. The fine columnar crystal 20, the active layer 21, and the semiconductor covering layer 22 form the nanocolumns 23.

The fine columnar crystal 20 and the semiconductor covering layer 22 are made of a group-III nitride semiconductor such as gallium nitride (GaN). Alternatively, the fine columnar crystal 20 and the semiconductor covering layer 22 may be made of a quaternary mixed crystal material represented by a general formula $Al_xGa_yIn_{1-x-y}N$ ($0 \leq x \leq 1$, $0 \leq y \leq 1$, and $0 \leq x+y \leq 1$) or boron nitride. The quaternary mixed crystal material has a wide band gap of 0.63 eV to 6.2 eV at a room temperature according to composition ratios x and y. Therefore, when the quaternary mixed crystal is used, it is possible to manufacture a light emitting diode or a laser diode covering from an ultraviolet range to an infrared range including a visible light range.

It is preferable that the diameter of the fine columnar crystal 20 be equal to or more than 10 nm and equal to or less than 1000 nm. In the range, the diameter of the fine columnar crystal 20 is preferably equal to or less than 700 nm, more preferably, equal to or less than 650 nm, and more preferably, equal to or less than 600 nm. When the diameter is equal to or less than 700 nm, particularly, equal to or less than 600 nm, it is easy to prevent the occurrence of threading dislocation.

The diameter of the fine columnar crystal 20 is the diameter of a columnar portion 201 exposed from the mask opening portion. When the columnar portion 201 has a cylindrical shape, the diameter of the columnar portion 201 is the diameter of the column. When the columnar portion 201 has shapes other than the cylindrical shape, the diameter of the columnar portion 201 means the length of a straight line having the largest length between two intersection points among the straight lines that pass through the center of gravity (the center of the plane) in a plan view of the columnar portion 201 from the surface side of the semiconductor substrate and intersect the columnar portion 201 at two points.

The fine columnar crystal 20 includes the columnar portion 201 and a facet structure 202 that is provided at the leading end of the columnar portion 201. The shape of the columnar portion 201 is not particularly limited. However, for example, the columnar portion 201 may have a cylindrical shape, a square pillar shape, or a hexagonal column shape.

It is preferable that the fine columnar crystal 20 be made of a material having a hexagonal crystal structure in terms of the stability of manufacture.

The active layer 21 is provided so as to cover the facet structure 202 of the fine columnar crystal 20. The active layer 21 is made of, for example, InGaN, GaN, AlGaN, AlInGaN, InGaAsN, or InN. Specifically, the active layer 21 may have, for example, a multiple quantum well (MQW) structure of InGaN/GaN (barrier layer: InGaN, and well layer: GaN), $In_xGa_{1-x}N/In_yGa_{1-y}N$ ($0 \leq x \leq 1$, $0 \leq y \leq 1$), GaN/AlGaN (barrier layer: AlGaN, and well layer: GaN), or $Al_xGa_{1-x}N/Al_yGa_{1-y}N$ ($0 \leq x \leq 1$, $0 \leq y \leq 1$), or a single quantum well (SQW) structure. The quantum well structure includes a quantum well layer and barrier layers having the quantum well layer interposed therebetween. The band gap of the barrier layer is more than that of the quantum well layer.

The semiconductor covering layer 22 is provided on the active layer 21 and covers the entire active layer 21.

In this embodiment, the peak wavelength of light emitted from the active layer 21 may be determined to a wavelength corresponding to the diameter Δ of the fine columnar crystal 20 immediately before the active layer 21 is formed. The peak wavelength of light emitted from the active layer 21 may be determined such that it shifts to the long wavelength side as the diameter Δ of each fine columnar crystal 20 increases and it shifts to the short wavelength side as the diameter Δ of each fine columnar crystal 20 decreases. That is, the peak wavelength of light emitted from the active layer 21 on the fine columnar crystal 20 with a large diameter Δ is more than that of light emitted from the active layer 21 on the fine columnar crystal 20 with a small diameter Δ.

Therefore, it is possible to obtain a desired emission wavelength by controlling the diameter Δ of the fine columnar crystal 20. It is possible to set the diameter Δ of the fine columnar crystal 20 to a desired value by adjusting the diameter δ (FIG. 1(C)) of each of the concave portions 14 formed in the group-III nitride semiconductor layer 12P of the template substrate, which will be described below. The diameter δ of the concave portion 14 depends on the size of the mask opening portion. Therefore, when the size of the mask opening portion is predetermined, it is possible to obtain the diameter δ corresponding to the predetermined size.

In addition, the peak wavelength of light emitted from the active layer 21 may be determined to a wavelength corresponding to the surface area of the leading end (facet structure 202) of the fine columnar crystal 20 of each of the nanocolumns 23. The peak wavelength of light emitted from the active layer 21 may be determined such that it shifts to the long wavelength side as the surface area of the facet structure increases and it shifts to the short wavelength side as the surface area of the facet structure decreases. That is, the peak wavelength of light emitted from the active layer 21 on the fine columnar crystal 20 having the facet structure with a large surface area is more than that of light emitted from the active layer 21 on the fine columnar crystal 20 having the facet structure with a small surface area.

Therefore, it is possible to obtain a desired emission wavelength by controlling the surface area of the facet structure at the leading end of the fine columnar crystal 20.

Figure 2:
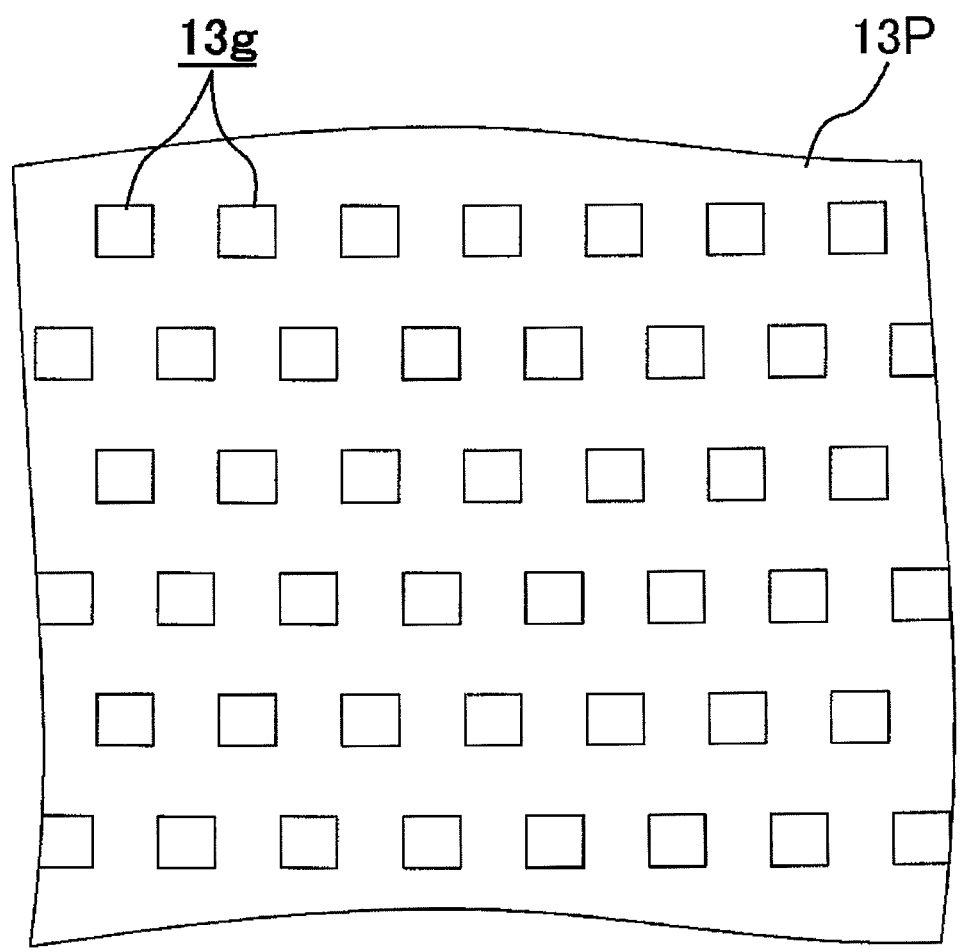
FIG. 2 is a diagram illustrating an example of the pattern of opening portions formed in a mask pattern.

As shown in FIG. 2, the opening portions 13g, . . . , 13g formed in the mask pattern 13P are periodically arranged in the in-plane direction of the mask pattern 13P.

When a region in which the arrangement density of a plurality of opening portions is high and a region in which the arrangement density of a plurality of opening portions is low are formed in the mask pattern, the peak wavelength of light emitted from the active layer 21 on a plurality of fine columnar crystals 20 in the region in which the arrangement density of the opening portions is high is more than that of light emitted from the active layer 21 on a plurality of fine columnar crystals 20 in the region in which the arrangement density of the opening portions is low.

That is, the peak wavelength of light emitted from the active layer 21 may be determined such that it shifts to the long wavelength side as the in-plane density of the fine columnar crystals 20, . . . , 20 increases and it shifts to the short wavelength side as the in-plane density of the fine columnar crystals 20, . . . , 20 decreases. The in-plane density increases as the spatial period of the fine columnar crystals 20, . . . , 20 is reduced, or the in-plane density increases as the diameter of the fine columnar crystals 20 increases.

Next, a preferred method of manufacturing the semiconductor optical element array 10 according to this embodiment will be described with reference to FIGS. 1(A) to 1(D).

First, for example, a gallium nitride or aluminum nitride buffer layer (not shown) is grown on the base substrate 11 by a low-temperature process using an MOCVD method or an MBE method, and the group-III nitride semiconductor layer 12 made of, for example, gallium nitride or aluminum nitride is grown on the buffer layer (FIG. 1(A)). As a result, a template substrate including the substrate 11 and the group-III nitride semiconductor layer 12 is manufactured. Then, the metal mask layer 13 including titanium (Ti) is formed in a predetermined region of the main surface of the template substrate (FIG. 1(B)). The metal mask layer 13 may be a natural oxide film of titanium or a titanium oxide film.

The metal mask layer 13 is preferably made of titanium in terms of the selective growth of the fine columnar crystals 20, but the material is not limited thereto. For example, the metal mask layer 13 may be made of one or two or more kinds of metal materials selected from the group consisting of titanium (Ti), tantalum (Ta), iron (Fe), nickel (Ni), platinum (Pt), gold (Au), cobalt (Co), tungsten (W), and molybdenum (Mo).

Then, as shown in FIG. 1(C), the metal mask layer 13 is patterned to form the mask pattern 13P having a plurality of opening portions through which the surface of the group-III nitride semiconductor layer 12P is exposed. The patterning may be performed by a lithography process. That is, the mask pattern 13P may be obtained by forming a resist pattern on the metal mask layer 13 and performing etching using the resist pattern as an etching mask. Alternatively, the mask pattern 13P may be formed by emitting a predetermined dose (the amount of ions emitted per unit area) of focused ion beams to the metal mask layer 13 using a FIB (Focused Ion Beam) method.

When the metal mask layer 13 is patterned, the group-III nitride semiconductor layer 12 disposed immediately below the opening portions is processed as well as the metal mask layer 13. Therefore, as shown in FIG. 1(C), dot-shaped concave portions (holes) 14, . . . , 14 are formed immediately below the opening portions of the mask pattern 13P. The shape of the opening portion of the mask pattern 13P in a top view (that is, the shape of the concave portion 14 in a top view) is not particularly limited. For example, the opening portion may have an axisymmetric shape, such as a circular shape or a polygonal shape, in addition to the square shape shown in FIG. 2.

Then, the fine columnar crystals 20, the active layers 21, and the semiconductor covering layers 22 are continuously growth from the plurality of concave portions 14 to the upper side of the mask pattern 13P through the mask opening portions by an MOCVD method or an MBE method (FIG. 1(D)). The fine columnar crystals 20 are grown in the horizontal direction along the in-plane direction of the template substrate at the same time as it is grown on the mask pattern 13P. Therefore, the diameter $\Delta$ of the nanocolumn 23 is greater than the diameter $\delta$ of the concave portion 14. In addition, since the semiconductor covering layer 22 is formed so as to cover the entire active layer 21, the active layer 21 does not have any portion exposed to an external space. In other words, the active layer 21 is completely buried in the leading end of the nanocolumn 23. Therefore, the formation of non-emission recombination potential due to the exposed portion is prevented, and it is possible to obtain high internal quantum efficiency.

In addition, since the fine columnar crystals 20 is grown in the horizontal direction, the following effects are obtained.

Since the diameter of the mask opening portion is reduced, the occurrence of threading dislocation is prevented at the beginning of the growth of the fine columnar crystals 20. Thereafter, when the fine columnar crystal is grown in the horizontal direction to increase the diameter, it is possible to obtain a nanocolumn with a relatively large diameter (for example, a diameter of 1000 nm) without threading dislocation.

For example, a method of relatively increasing the amount of nitrogen supplied or a method of adding Al (for example, a method of producing AlGaN) may be used to grow the fine columnar crystals 20 in the horizontal direction.

Figure 3:
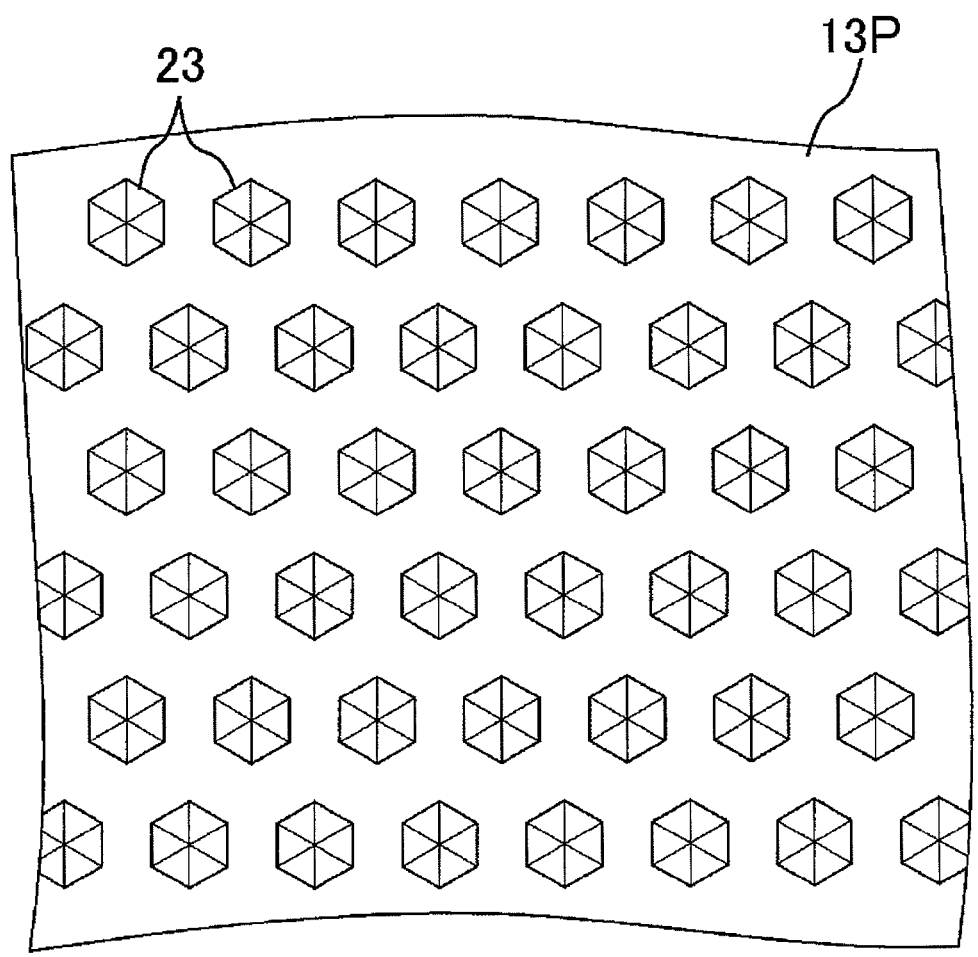
FIG. 3 is a diagram illustrating an example of the pattern of nanocolumns.
Figure 4:
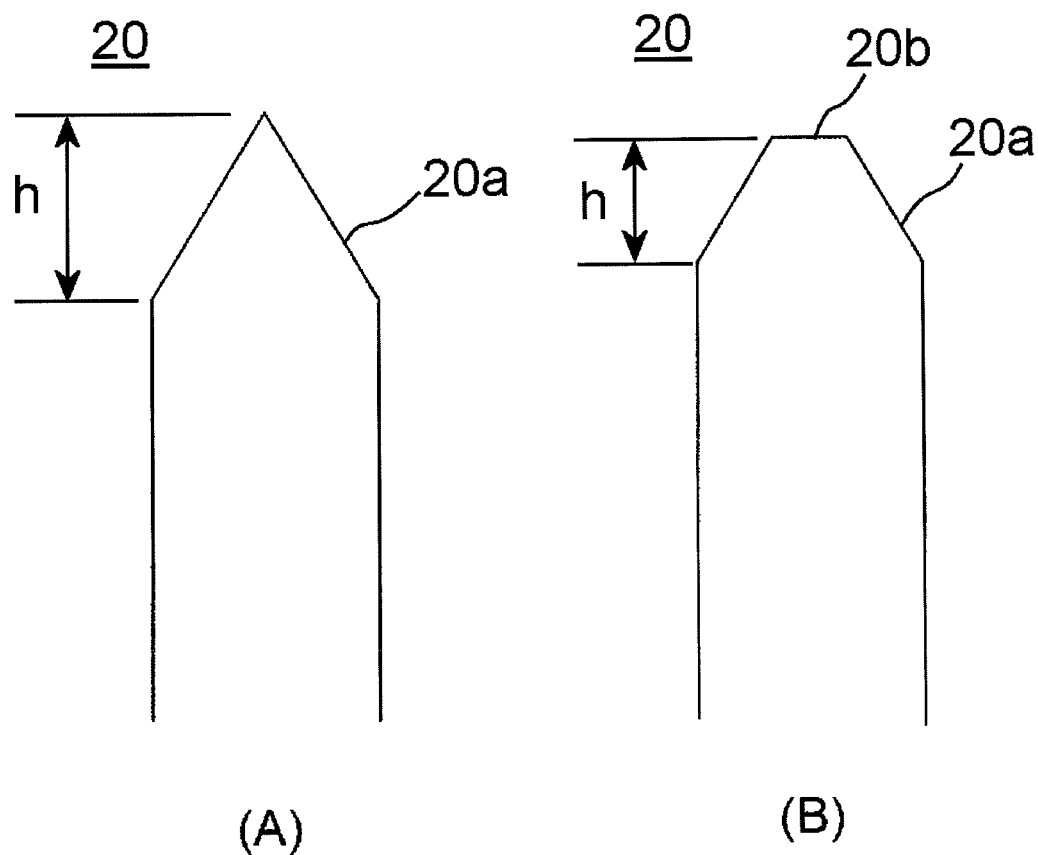
FIGS. 4((A) and (B)) is diagrams schematically illustrating the sectional shape of the leading end of the nanocolumn along the center axis.

When a group-III nitride semiconductor having a wurtzite-type crystal structure is grown in the direction of a polar plane, which is called the c-plane (=the (0001)-plane), to form the fine columnar crystal 20, the nanocolumn 23 (or the fine columnar crystal 20) has a hexagonal shape in a top view, as shown in FIG. 3. FIGS. 4(A) and 4(B) are diagrams illustrating the sectional shape of the leading end of the fine columnar crystal 20 along the center axis. The leading end shown in FIG. 4(A) has a facet structure and includes an inclined plane, which is a semipolar plane 20a of the wurtzite-type crystal structure, as a facet surface that is obliquely inclined.

The leading end has a six-sided pyramid shape. Examples of the semipolar plane 20a include the (10-1-1)-plane, the (10-1-3)-plane, the (11-22)-plane, the (11-24)-plane, and the (10-12)-plane. The leading end shown in FIG. 4(B) also has a facet structure and includes an inclined plane, which is the semipolar plane 20a of the wurtzite-type crystal structure, and a flat polar plane 20b as a facet surface that is obliquely inclined and a plane that faces upward. The shape of the leading end shown in FIG. 4(A) or the shape of the leading end shown in FIG. 4(B) is formed according to crystal growth conditions.

The facet structure means a polyhedral structure having a facet surface that is inclined with respect to the horizontal plane of the base substrate 11 as a side surface.

When the diameter of the fine columnar crystal 20 is small, the leading end having the six-sided pyramid shape shown in FIG. 4(A) is likely to be formed. When the diameter of the fine columnar crystal 20 is large, the leading end shown in FIG. 4(B) is likely to be formed. When the diameter of the fine columnar crystal 20 is equal to or more than about 300 nm, it is possible to clearly form the flat polar plane 20b at the leading end of the fine columnar crystal 20, which depends on the crystal growth conditions. In addition, when the diameter of the fine columnar crystal 20 is more than about 300 nm, the area of the flat polar plane 20b increases.

When the fine columnar crystal 20 is grown by the MBE method, a raw material gas including active nitrogen and group-III metal generated by high-frequency plasma excitation is introduced to the surface of the template substrate to grow the fine columnar crystal 20. In this case, the growth conditions may be as follows: the fine columnar crystal 20 is grown under the condition that the effective supply rate of the active nitrogen is higher than that of the group-III metal. For example, when the fine columnar crystal 20 made of gallium nitride (GaN) is grown, in many cases, a GaN crystal is grown in a growth inhibitory region other than the mask opening portion at a crystal growth temperature of 600 degrees centigrade or more. As the growth temperature increases, the spatial density of the GaN crystal grown in the growth inhibitory region is reduced. When the temperature is equal to or more than a predetermined value, GaN may not be grown in the growth inhibitory region. The temperature at which GaN is not grown in the growth inhibitory region depends on the amount or ratio of group-III metal and active nitrogen supplied. For example, the temperature is equal to or more than 850 degrees centigrade.

It is preferable that MBE be performed under the following conditions in order to grow the fine columnar crystal 20. The temperature is appropriately selected according to the kind of group-III nitride semiconductor to be grown, and is equal to or more than 350 degrees centigrade and equal to or less than 1200 degrees centigrade. For example, a GaN crystal is grown, the temperature is preferably equal to or more than 400 degrees centigrade and equal to or less than 1000 degrees centigrade. When an AlN crystal is grown, the temperature is preferably equal to or more than 500 degrees centigrade and equal to or less than 1200 degrees centigrade. When InN is grown, the temperature is preferably equal to or more than 350 degrees centigrade and equal to or less than 600 degrees centigrade. When MBE is performed under nitrogen-rich conditions in the above-mentioned temperature range, it is possible to grow the fine columnar crystal 20 of a group-III nitride semiconductor.

In this embodiment, a region of the mask pattern 13P in which the mask opening portion is not formed is a region (growth inhibitory region) in which the growth of the fine columnar crystal 20 is inhibited. The reason why crystal growth in the horizontal direction is inhibited in the growth inhibitory region is not clear, but it is estimated that the crystal growth in the horizontal direction is inhibited since the separation of, for example, gallium (Ga) from the surface of the mask pattern 13P is more accelerated than that from the exposed surface of the template substrate. When attention is focused on the physical properties of Ti and Pt, the materials have a melting point or a boiling point higher than that of other metal materials, high binding energy per covalent bond, and a thermal conductivity lower than that of other metal materials. Ti and Pt have a smaller number of non-bonded hands on the surface because of the strength of the covalent bond. For this reason, it is difficult to expect the facility of bonding and it is estimated that the start of the growth of the group-III nitride fine columnar crystal is inhibited.

In the crystal growth process, active nitrogen is emitted to the surface of the metal film independently or together with a group-III metal material. In the case of a metal material having a nitride forming function, it is estimated that metal nitride (for example, TiN or WN) is formed. Since these metal nitrides are chemically stable, that is, there are a small number of active non-bonded hands on the surface, the bonding with Ga or GaN is weak. Therefore, it is also considered that, when a growth temperature is sufficiently high for the elimination of, for example, Ga or GaN from the surface, the supplied Ga or GaN is eliminated before it has a sufficient size to maintain crystal growth, and the growth of GaN is inhibited.

From the above, in particular, a synergistic effect of the fact that the temperature in the growth inhibitory region is higher than that in the surface of the substrate and the fact that the growth nucleus of GaN is less likely to be formed in the growth inhibitory region can be expected as the reason why crystal growth in the horizontal direction is inhibited in the growth inhibitory region.

On the other hand, the inhibition of crystal growth does not occur on the exposed surface of the group-III nitride semiconductor layer 12P of the template substrate. The fine columnar crystal 20 formed on the surface of the mask pattern 13P and the template substrate may vary depending on the material forming the template substrate or the mask pattern 13P, the thickness of the mask pattern 13P, or the growth conditions. The fine columnar crystal 20 is grown in a direction substantially vertical to the main surface of the template substrate or the surface of the mask pattern 13P.

The fine columnar crystal 20 that is made of a group-III nitride semiconductor grown by the method according to this embodiment is a single crystal having a columnar structure with a nanometer-order diameter Δ. The diameter of the fine columnar crystal 20 is set in the range of equal to or more than 10 nm and equal to or less than 1000 nm. The height of the fine columnar crystal 20 varies depending on the thickness of the mask pattern 13P or the crystal growth conditions. For example, the height of the fine columnar crystal 20 is equal to or more than 0.2 μm and equal to or less than 5 μm. The thickness of the mask pattern 13P is not particularly limited. It is preferable that the thickness of the mask pattern 13P be equal to or more than 2 nm and equal to or less than 100 nm. However, the diameter and height of the fine columnar crystal 20 vary depending on the crystal growth conditions.

Thereafter, the active layer 21 is formed on each of the fine columnar crystals 20, and the semiconductor covering layer 22 is formed on the active layer 21. The active layer 21 and the semiconductor covering layer 22 may be formed by the MOCVD method and the MBE method.

The material forming the active layer 21 or the semiconductor covering layer 22 is also deposited on the mask pattern 13P.

When the semiconductor covering layer 22 is formed, it is preferable that the semiconductor covering layer 22 be grown in the horizontal direction to cover the side surface of the active layer 21 as well as the upper surface.

(Dependence of Emission Wavelength on Diameter of Crystal)

Figure 5:
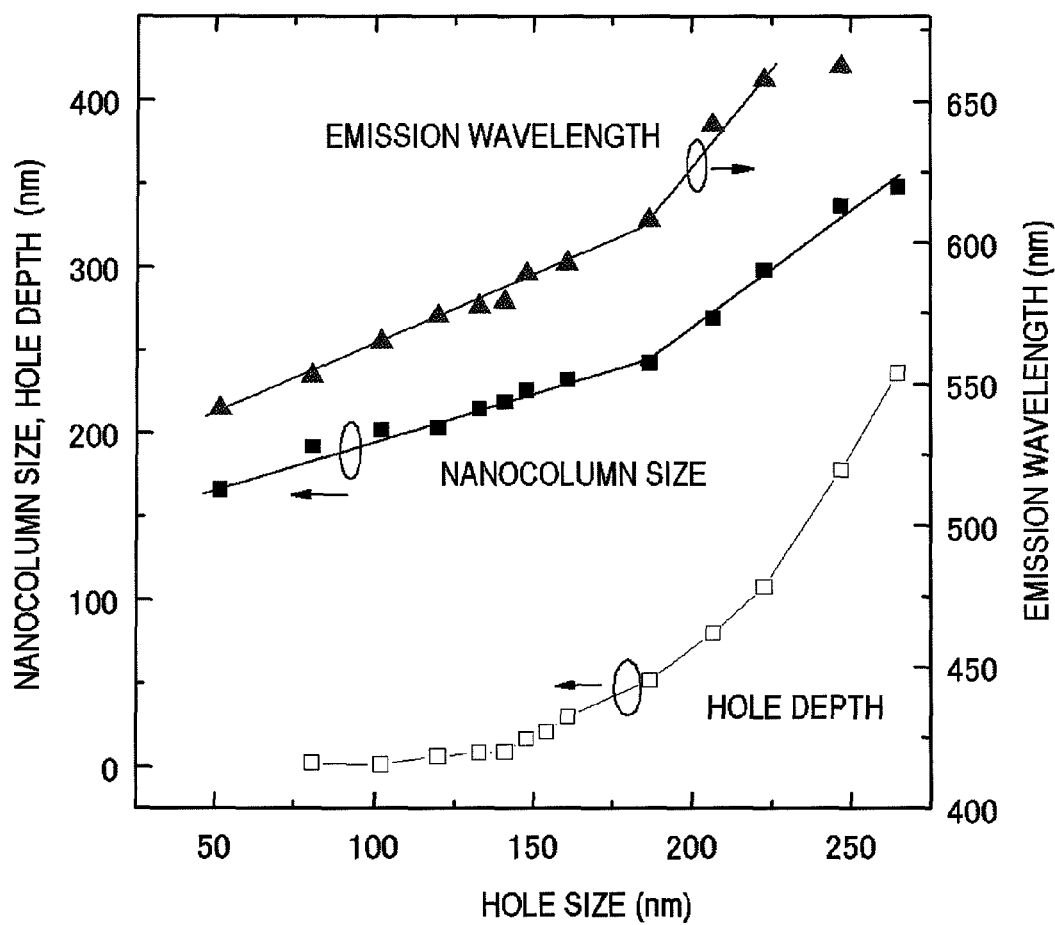
FIG. 5 is a graph illustrating the relationship between the diameter of a concave portion formed in a template substrate and the emission wavelength of the nanocolumn.

FIG. 5 is a graph illustrating the relationship between the diameter δ (hereinafter, referred to as a "hole size") of the concave portion 14 formed in the group-III nitride semiconductor layer 12P and the emission wavelength of the nanocolumn 23.

The manufacturing conditions of the nanocolumn 23 manufactured in order to obtain the graph shown in FIG. 5 are as follows. The GaN layer 12P (thickness: about 3.5 μm) was grown on the (0001)-plane of the sapphire substrate 11 by the MOCVD method to form a template substrate. A titanium thin film (thickness: about 5 nm) was formed on the template substrate and a plurality of opening portions (spatial period (the distance between the centers of the opening portions):

400 nm) arranged in a triangle lattice was provided in the titanium thin film by the FIB method, thereby forming the mask pattern 13P. At the same time as the mask opening portions were formed, the concave portions 14 were formed in the GaN layer 12P. Then, the GaN columnar crystals 20 (height: 2.5 µm) were grown from the concave portions 14 of the template substrate through the mask opening portions by an RF-MBE method at a temperature of 900 degrees centigrade. Then, the active layer 21 that had a multiple quantum well structure including an InGaN film (thickness: 1 nm) was formed on each of the fine columnar crystals 20. Then, the GaN crystal semiconductor covering layer 22 (thickness: 10 nm) was formed on the active layer 21.

Under the manufacturing conditions, thirteen semiconductor light emitting element samples having different hole sizes δ in the range of 50 nm to 265 nm were manufactured. In each of the samples, the depth of the concave portion 14 (hereinafter, referred to as a "hole depth"), a PL (photoluminescence) emission wavelength, and the diameter (hereinafter, referred to as a "nanocolumn size") of the nanocolumn 23 were measured. FIG. 5 is graph illustrating the measurement result.

As can be seen from the graph of FIG. 5, as the hole size δ increased, the hole depth tended to increase, the hole size tended to increase, and the emission wavelength tended to increase. On the other hand, as the hole size decreased, the hole depth tended to decrease, the nanocolumn size tended to decrease, and the emission wavelength tended to decrease.

Figure 6:
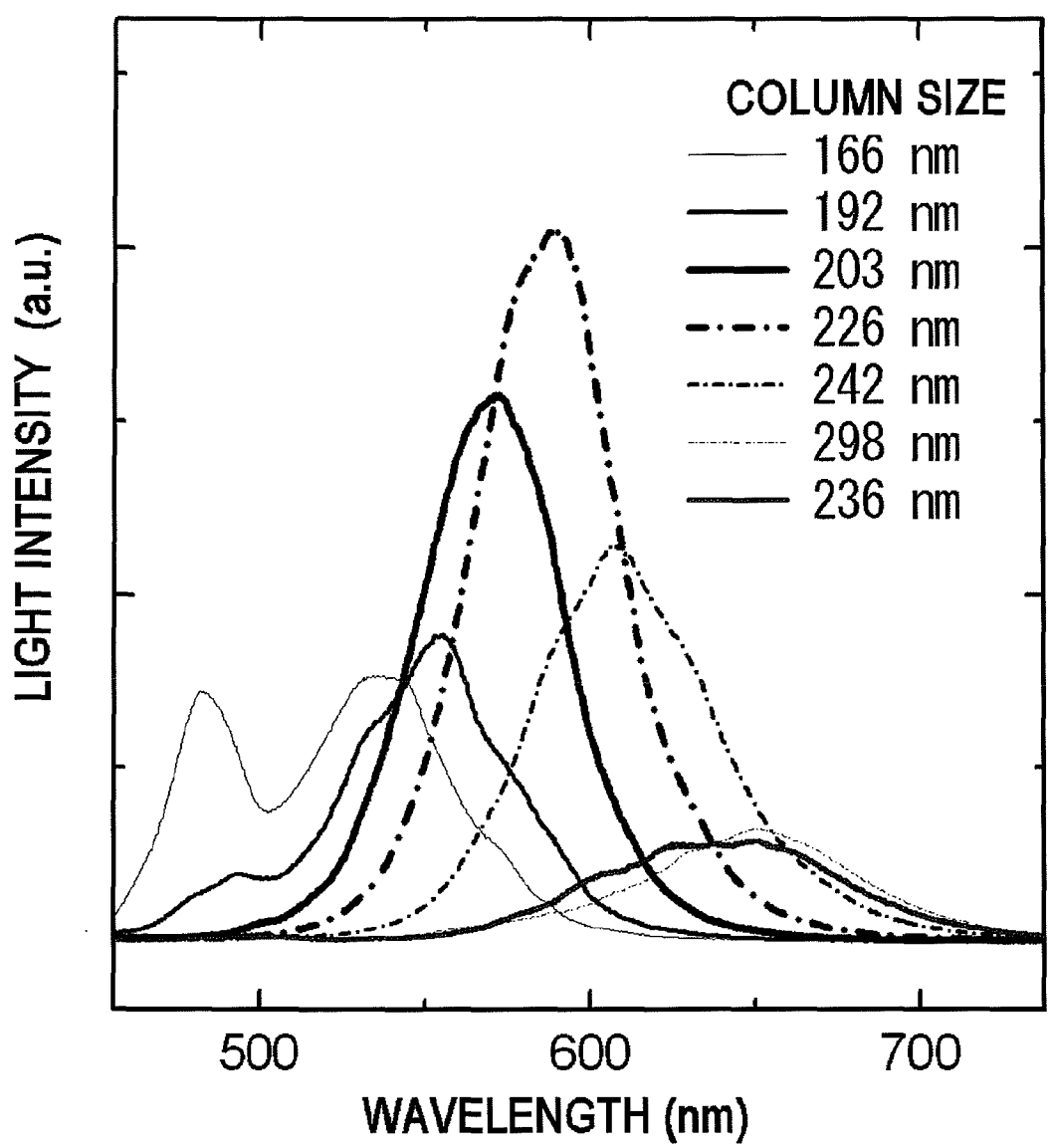
FIG. 6 is a graph illustrating the relationship between a PL emission wavelength and light intensity.

FIG. 6 is a graph illustrating the relationship between the PL emission wavelength (unit: nm) and light intensity (unit: arbitrary unit) measured for the semiconductor elements having nanocolumn sizes of 166 nm, 192 nm, 203 nm, 226 nm, 242 nm, 298 nm, and 236 nm. The manufacturing conditions of the nanocolumns 23 manufactured in order to obtain the graph are the same as those of the nanocolumns 23 manufactured in order to obtain the graph shown in FIG. 5.

Figure 7:
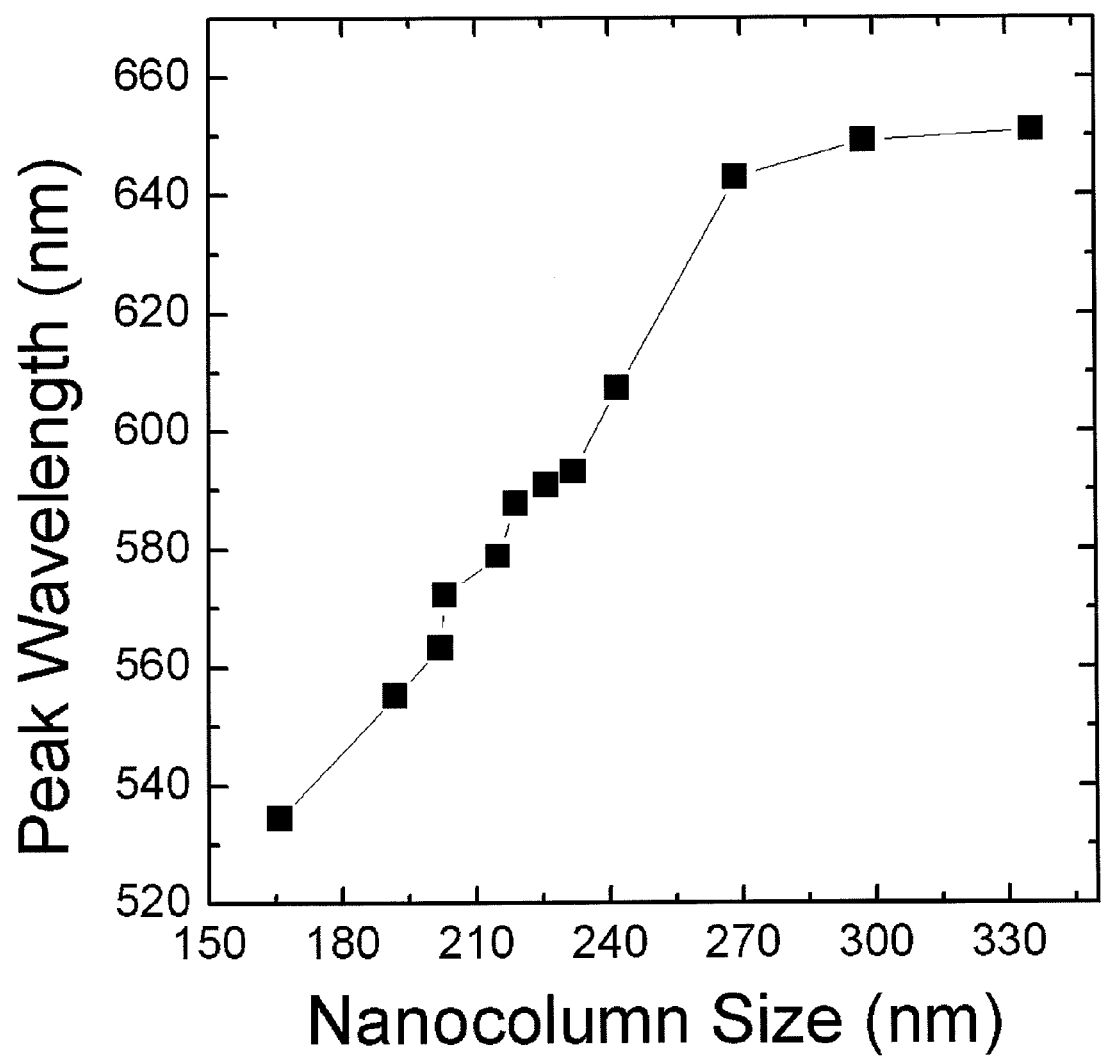
FIG. 7 is a graph illustrating the relationship between the diameter of the nanocolumn (Nanocolumn Size) and a detected peak wavelength (Peak Wavelength).

A peak wavelength for each nanocolumn size was detected from the light intensity distribution shown in FIG. 6. FIG. 7 is a graph illustrating the relationship between the nanocolumn size and the detected peak wavelength. As can be seen from the graph, as the nanocolumn size increased, the peak wavelength increases, and as the nanocolumn size decreases, the peak wavelength decreases.

Considering that the structure of the active layer 21 emitting light depends on the shape of the leading end of the fine columnar crystal 20, as can be seen from the graphs of FIGS. 5 to 7, the peak wavelength of light emitted from the active layer 21 shifts to the long wavelength side as the diameter Δ of the fine columnar crystal 20 immediately before the active layer 21 is formed increases, and the peak wavelength shifts to the short wavelength side as the diameter Δ of the fine columnar crystal 20 decreases.

Figure 8:
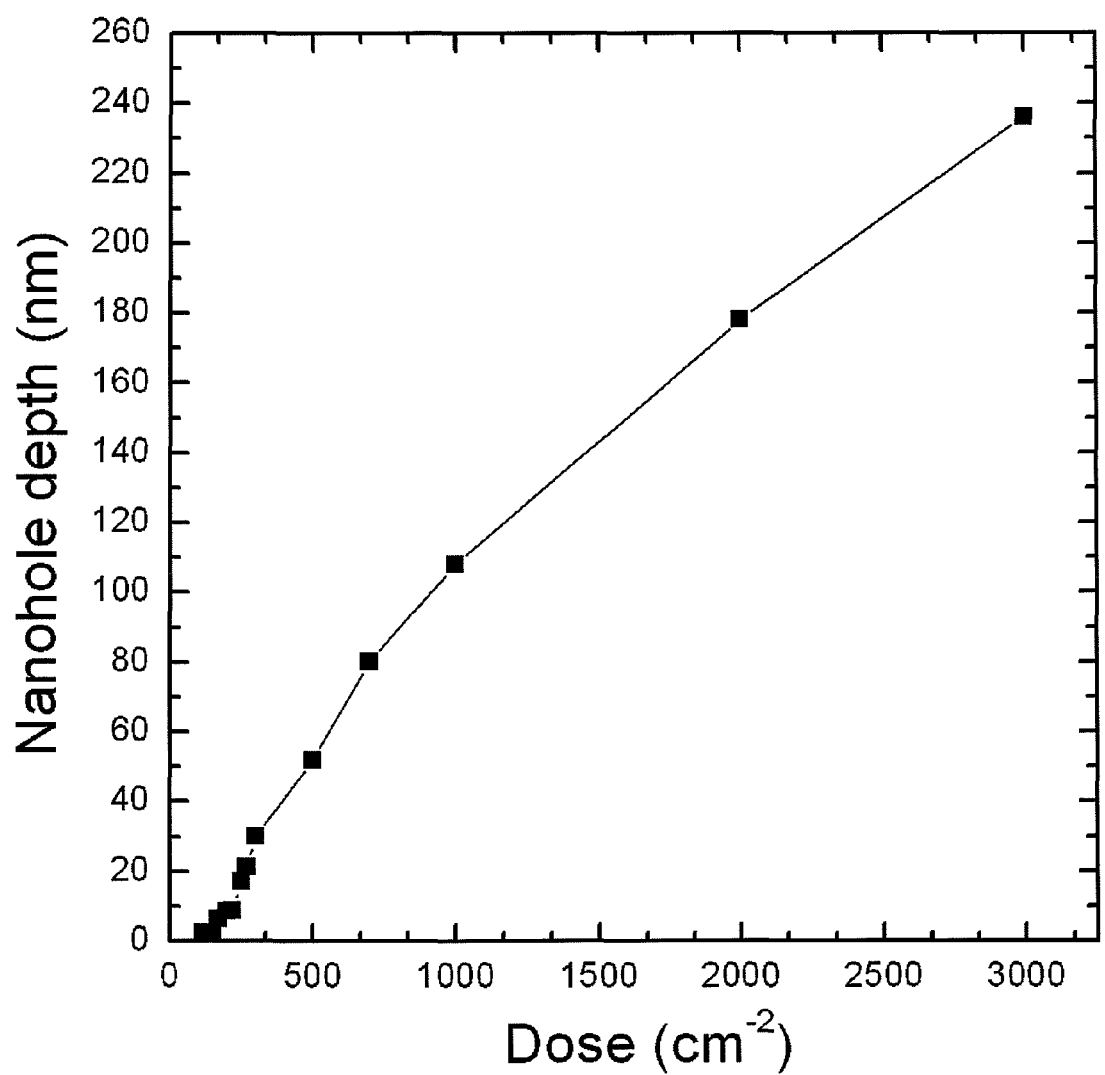
FIG. 8 is a graph illustrating the relationship between the depth of the concave portion (Nanohole depth) and a dose (Dose) when the concave portion is formed in the template substrate by a FIB method.
Figure 9:
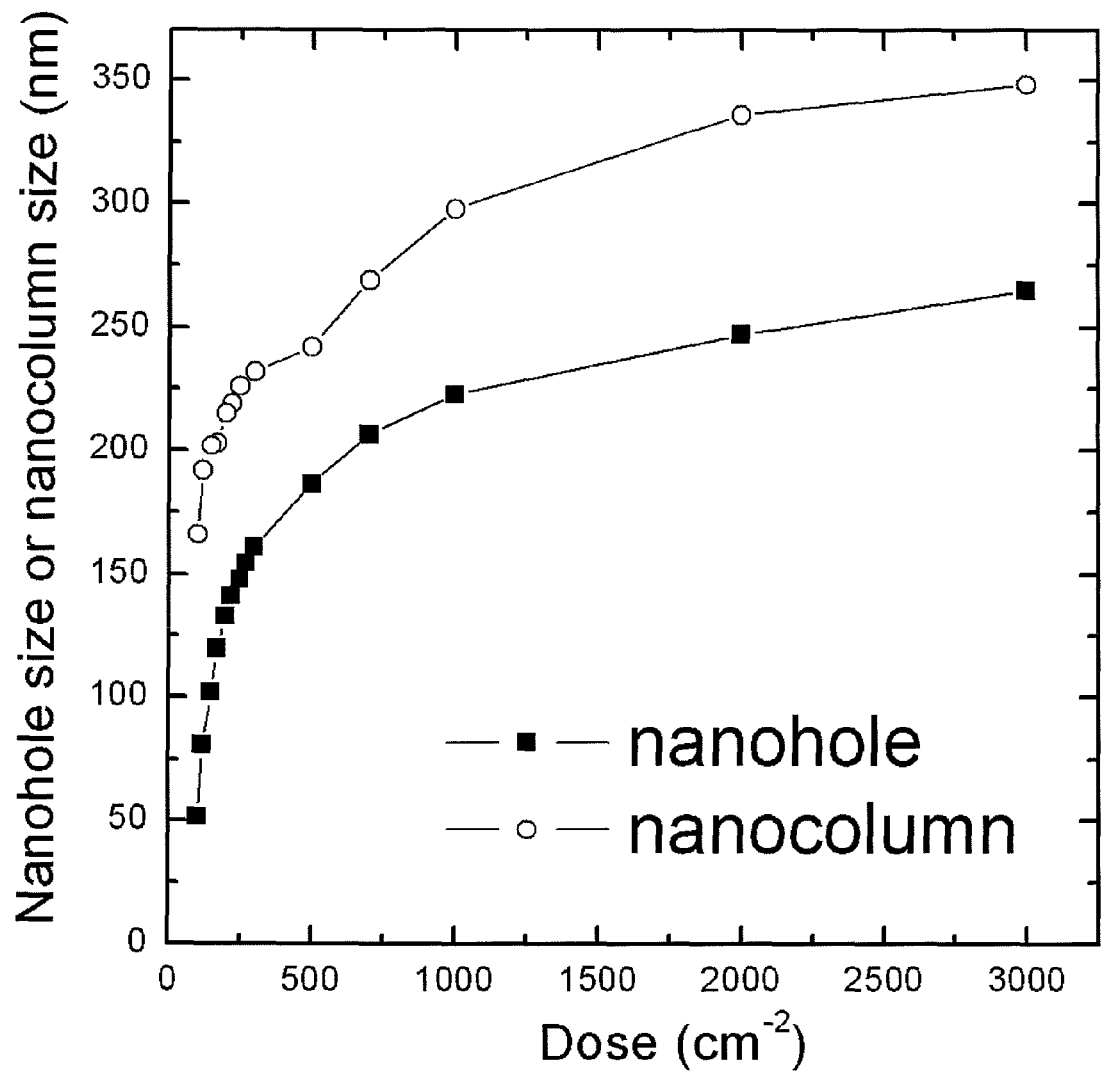
FIG. 9 is a graph illustrating the relationship between a dose (Dose) and the diameter of the concave portion (Nanohole size) and the relationship between a dose (Dose) and the diameter of the nanocolumn (Nanocolumn size).

FIG. 8 is a graph illustrating the relationship between the depth of the concave portion 14 (nanohole depth (nm)) and a dose when the concave portion (hole) 14 is formed in the template substrate by the FIB method (dose (cm$^{-2}$)). FIG. 9 is a graph illustrating the relationship between a dose (Dose (cm$^{-2}$)) and the diameter of the concave portion 14 (nanohole size (nm)) and the relationship between a dose (dose (cm$^{-2}$)) and the diameter of the nanocolumn 23 (nanocolumn size (nm)).

The manufacturing conditions of the nanocolumn 23 manufactured in order to obtain the graphs shown in FIGS. 8 and 9 are as follows. The GaN layer 12P (thickness: about 3.5 µm) was grown on the (0001)-plane of the sapphire substrate 11 by the MOCVD method to form a template substrate. A titanium thin film (thickness: about 5 nm) was formed on the template substrate and a plurality of opening portions was provided in the titanium thin film by the FIB method, thereby forming the mask pattern 13P. At the same time as the mask opening portions were formed, the concave portions 14 were formed in the GaN layer 12P. Then, the GaN columnar crystals 20 (height: 2.5 µm) were grown from the concave portions 14 of the template substrate through the mask opening portions by the RF-MBE method at a temperature of 900 degrees centigrade. Then, the active layer 21 that had a multiple quantum well structure including an InGaN film (thickness: 1 nm) was formed on each of the fine columnar crystals 20. Then, the GaN crystal semiconductor covering layer 22 (thickness: 10 nm) was formed on the active layer 21.

Under the manufacturing conditions, fourteen semiconductor light emitting element samples were manufactured with different doses. In each of the samples, the depth of the concave portion 14, the diameter δ of the concave portion 14, and the diameter of the nanocolumn 23 were measured. FIGS. 8 and 9 are graphs illustrating the measurement result.

As can be seen from the graph of FIG. 8, as a dose when a focused ion beam is emitted to the metal mask layer 13 increases, the depth of the concave portion 14 increases. As can be seen from the graph of FIG. 9, as a dose increases, the diameter of the concave portion 14 (nanohole size) increases and the diameter of the nanocolumn 23 (nanocolumn size) also increases. Therefore, it is understood that the diameter Δ of the columnar crystal 20 increases with an increase in the diameter of the concave portion 14.

Figure 10:
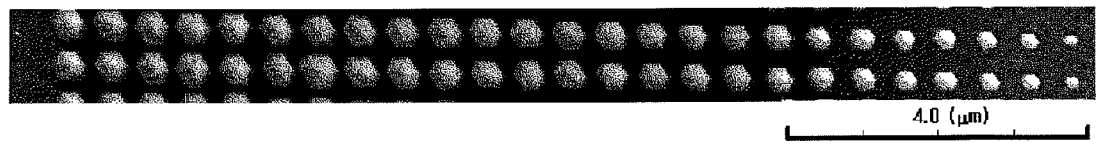
FIG. 10 is a diagram illustrating the scanning electron microscope image of the nanocolumns regularly arranged in a square lattice.
Figure 11:
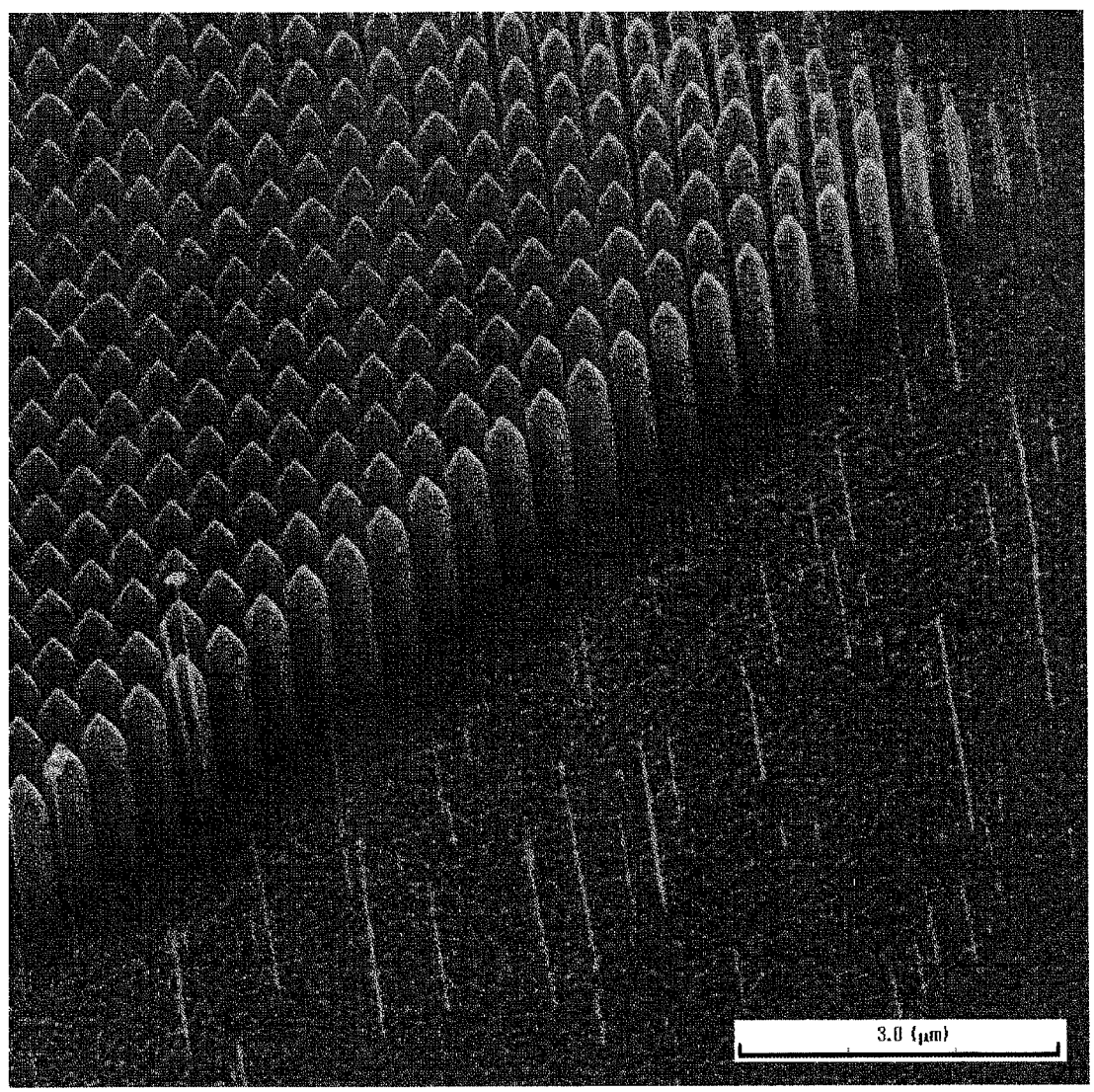
FIG. 11 is a scanning electron microscope image of the nanocolumns regularly arranged in a square lattice.

FIGS. 10 and 11 are diagrams illustrating the scanning electron microscope images (SEM image) of the nanocolumns 23, . . . , 23 that are regularly arranged in a square lattice and have different diameters. FIG. 10 shows the SEM image of the nanocolumns 23, . . . , 23, as viewed from the upper side, and FIG. 11 shows the SEM image of the nanocolumns 23, . . . , 23, as obliquely viewed. The nanocolumn groups shown in FIGS. 10 and 11 were formed by individually controlling the diameters of the concave portions 14, . . . , 14.

(Dependence of Emission Wavelength on Shape of Leading End)

Figure 12:
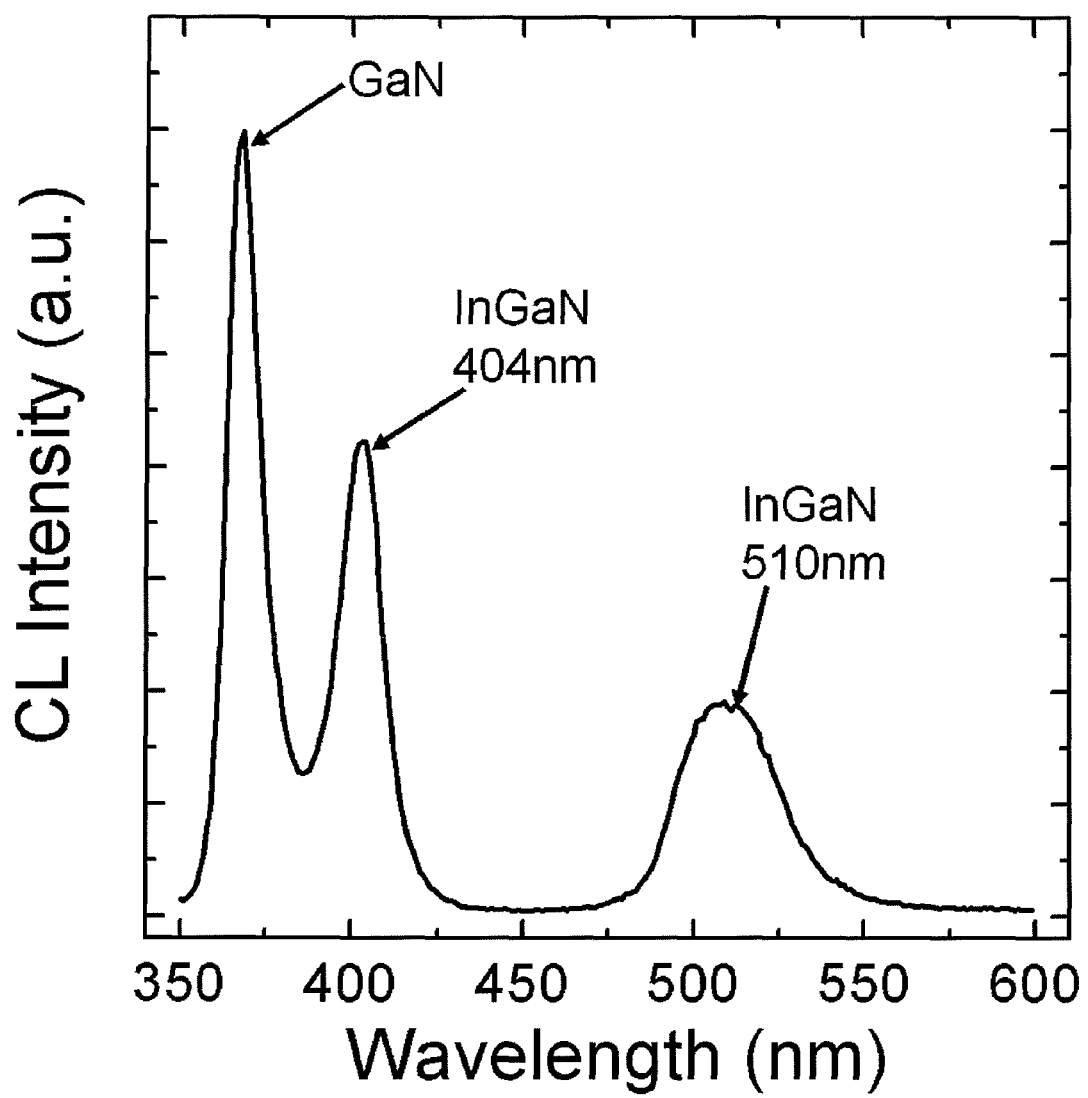
FIG. 12 is a graph illustrating the measurement result of the spectrum of CL (cathodoluminescence) light emitted from the nanocolumn.
Figure 13:
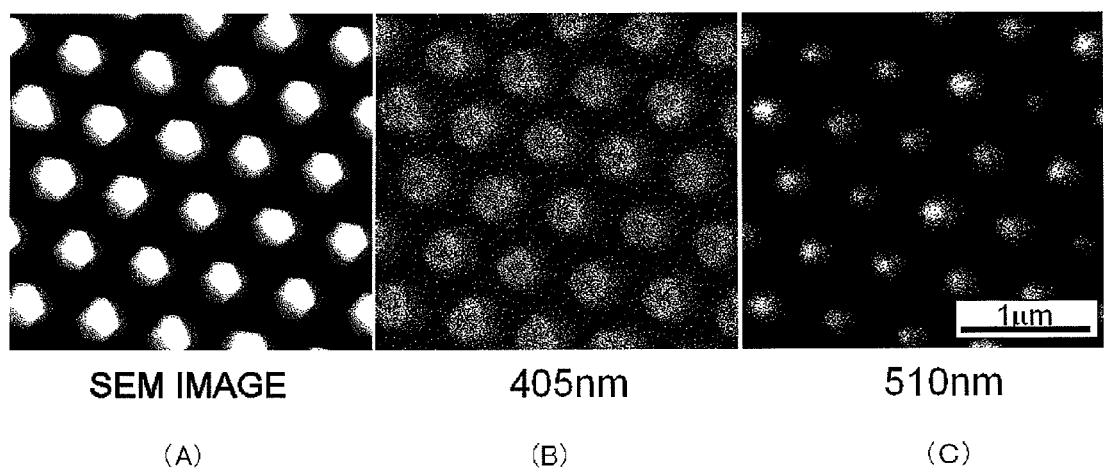
FIG. 13 shows the SEM image ((A)) of the nanocolumns, as viewed from the upper side, and the CL images ((B) and (C)) of different wavelengths (cathodoluminescence images), as viewed from the upper side.
Figure 14:
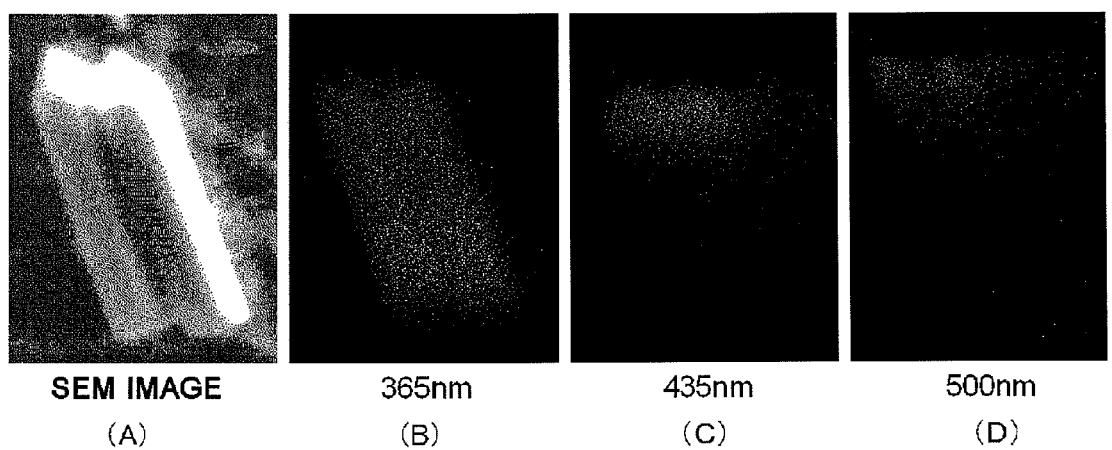
FIG. 14 shows the SEM image ((A)) of the nanocolumn captured in the horizontal direction, and the cross-sectional CL images ((B) to (D)) of different wavelengths.

FIG. 12 is a graph illustrating the measurement result of CL (cathodoluminescence) light emitted from the nanocolumn 23. In the graph, the horizontal axis corresponds to the emission wavelength and the vertical axis corresponds to CL intensity (arbitrary unit). FIG. 13(A) shows the SEM image of the nanocolumn 23, as viewed from the upper side, and FIGS. 13(B) and 13(C) are diagrams illustrating the CL images (cathodoluminescence images) of different wavelengths of 405 nm and 510 nm, as viewed from the upper side. FIG. 14(A) shows the SEM image of the nanocolumn 23 captured in the horizontal direction, and FIGS. 14(B), 14(C), and 14(D) show the cross-sectional CL images (the cross-sectional CL images of the nanocolumn 23 shown in FIG. 14(A)) of different wavelengths of 365 nm, 435 nm, and 500 nm.

The manufacturing conditions of the nanocolumn 23 manufactured in order to obtain the graphs shown in FIG. 12, FIGS. 13(A) to 13(C), and FIGS. 14(A) to 14(D) are as follows. The GaN layer 12P (thickness: about 3.5 µm) was grown on the (0001)-plane of the sapphire substrate 11 by the MOCVD method to form a template substrate. A titanium thin film (thickness: about 5 nm) was formed on the template substrate and a plurality of opening portions (spatial period: 400 nm) arranged in a triangle lattice was provided in the titanium thin film by the FIB method, thereby forming the mask pattern 13P. At the same time as the mask opening portions were formed, the concave portions 14 were formed in the GaN layer 12P. Then, the GaN columnar crystals 20 (height: 1.8 µm and diameter: 180 nm to 495 nm) were grown from the concave portions 14 of the template substrate through the mask opening portions by the RF-MBE method at a temperature of 900 degrees centigrade. Then, the active layer 21 that had a multiple quantum well structure including an InGaN film (thickness: 3 nm) was formed on each of the fine columnar crystals 20. Then, the GaN crystal semiconductor covering layer 22 (thickness: 10 nm) was formed on the active layer 21.

As shown in the graph of FIG. 12, the peak of light emitted from GaN and two peaks of light emitted from InGaN (wavelengths: 404 nm and 510 nm) are included in a CL intensity distribution.

The CL image of the wavelength 405 nm shown in FIG. 13(B) shows that light is emitted from the entire active layer 21 of the nanocolumns 23. It is considered that the CL image shows the emission of light from InGaN formed on the side surface (semipolar plane) 20*a* (FIG. 4(B)) of the leading end of the fine columnar crystal 20. In contrast, the CL image of the wavelength 510 nm shown in FIG. 13(C) shows the emission of light from only the vicinity of the top of the active layer 21 of the nanocolumn 23. It is considered that the CL image shows the emission of light from InGaN formed on the flat surface (polar plane) 20*b* (FIG. 4(B)) of the leading end of the fine columnar crystal 20.

The cross-sectional CL image of the wavelength 365 nm shown in FIG. 14(B) shows the emission of light from GaN distributed in the entire nanocolumn 23. The cross-sectional CL image of the wavelength 435 nm shown in FIG. 14(C) shows the emission of light from InGaN at the entire leading end of the nanocolumn 23. It is considered that the cross-sectional CL image mainly shows the emission of light from InGaN formed on the side surface (semipolar plane) 20*a* (FIG. 4(B)) of the leading end of the fine columnar crystal 20. The cross-sectional CL image of the wavelength 500 nm shown in FIG. 14(D) shows the emission of light from InGaN formed in the vicinity of the top of the nanocolumn 23. It is considered that the cross-sectional CL image mainly shows the emission of light from InGaN formed on the flat surface (polar plane) 20*b* (FIG. 4(B)) of the leading end of the fine columnar crystal 20.

As can be seen from FIG. 12, FIGS. 13(A) to 13(C), and FIGS. 14(A) to 14(D), the wavelength of light emitted from InGaN formed on the side surface (semipolar plane) 20*a* of the leading end of the fine columnar crystal 20 is different from that of light emitted from InGaN formed on the flat surface (polar plane) 20*b* of the leading end. It is considered that the reason is as follows.

Figure 15:
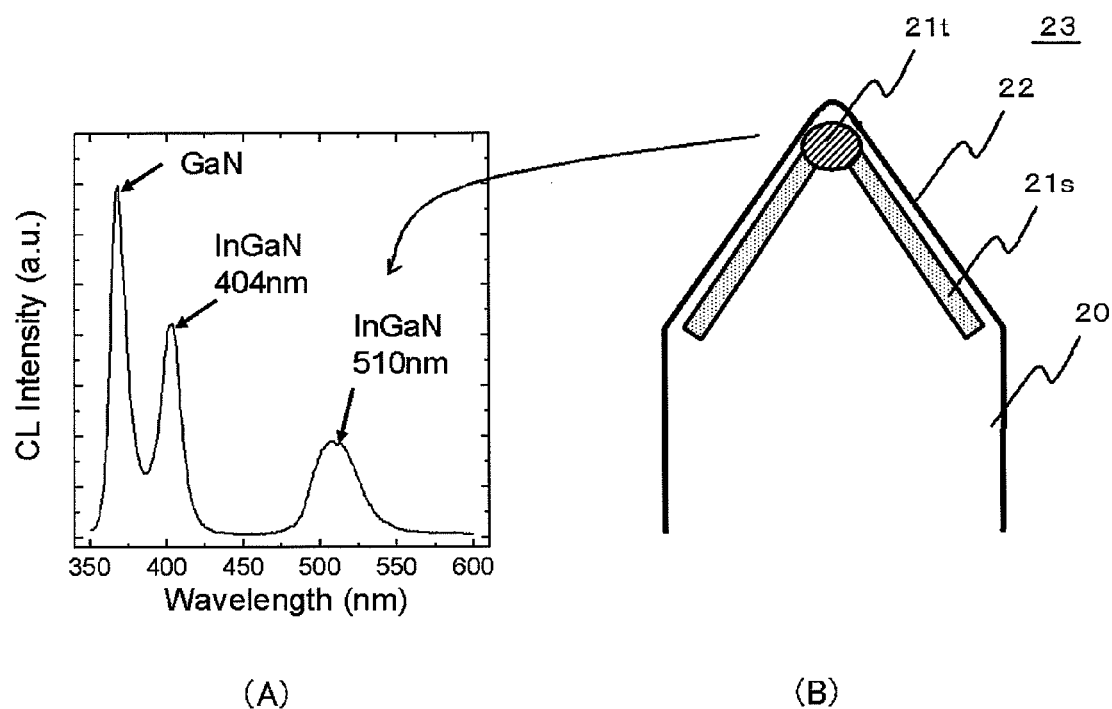
FIG. 15 is a graph ((A)) illustrating the same CL spectrum as that shown in FIG. 12, and a diagram ((B)) schematically illustrating the structure of the leading end of the nanocolumn.

As shown in FIG. 15(B), it is considered that, since the ease of incorporating In into the InGaN crystal is different in an InGaN crystal 21*s* formed on the side surface 20*a* of the fine columnar crystal 20 and an InGaN crystal 21*t* formed on the flat surface 20*b*, the composition ratio of In in the InGaN crystal 21*t* formed on the flat surface 20*b* is relatively high and the composition ratio of In in the InGaN crystal 21*s* formed on the side surface 20*a* is relatively low. Therefore, the CL spectrum (the same CL spectrum as that shown in FIG. 12) shown in FIG. 15(A) is formed. In addition, since carriers are confined in the InGaN crystal 21*t* that is formed in the vicinity of the leading end and has a narrow band gap, the InGaN crystal 21*t* in the vicinity of the leading end may form a quantum dot. It is considered that this causes the difference between the wavelength of light emitted from InGaN formed on the side surface 20*a* and the wavelength of light emitted from InGaN formed on the flat surface 20*b*.

Samples manufactured in order to obtain the CL intensity distribution shown in FIG. 12 were used to measure PL (photoluminescence) intensity. CW (Continuous Wave) light with a wavelength of 405 nm was used as excitation light. In addition, the density of the excitation light was 0.29 kW/cm$^2$. The peak wavelength of a PL intensity distribution was 486.2 nm under a low temperature condition of 4 K and 486.7 nm under a high temperature condition of 300 K. The full width at half maximum (FWHM) of the PL intensity distribution corresponded to 151.3 meV under a low temperature condition of 4 K and corresponded to 187.2 meV under a high temperature condition of 300 K. Therefore, the PL integrated intensity ratio of the low temperature condition and the high temperature condition, that is, internal quantum efficiency was about 77% with respect to a wavelength of 486 nm, and very high crystallinity was obtained. It is considered that one of the reasons for high internal quantum efficiency is that the active layer 21 (21*s* and 21*t*) is not exposed to the external space and the loss of injected carriers due to non-emission recombination is prevented. As shown in FIG. 15(B), the InGaN crystals 21*s* and 21*t* with a narrow band gap are completely covered by GaN with a wide band gap and are buried in the nanocolumn 23. Therefore, the InGaN crystals 21*s* and 21*t* are not exposed to the external space. As a result, it may be considered that the formation of non-emission recombination potential is prevented. If there is an exposed portion, a non-emission recombination potential is formed within the band gap of the surface of the exposed portion, and electrons and holes are recombined with each other through the non-emission recombination potential. As a result, emission efficiency is reduced.

The nanocolumn 23 having the InGaN crystals 21*s* and 21*t* is described in this embodiment. However, the nanocolumn 23 may not have the InGaN crystal 21*t*.

In the nanocolumn, it has been confirmed that the emission wavelength can also be controlled by the diameter of the nanocolumn. That is, it has been confirmed that the peak wavelength of light emitted from the active layer of the nanocolumn with a small diameter is smaller than that of light emitted from the active layer of the nanocolumn with a large diameter.

Figure 16:
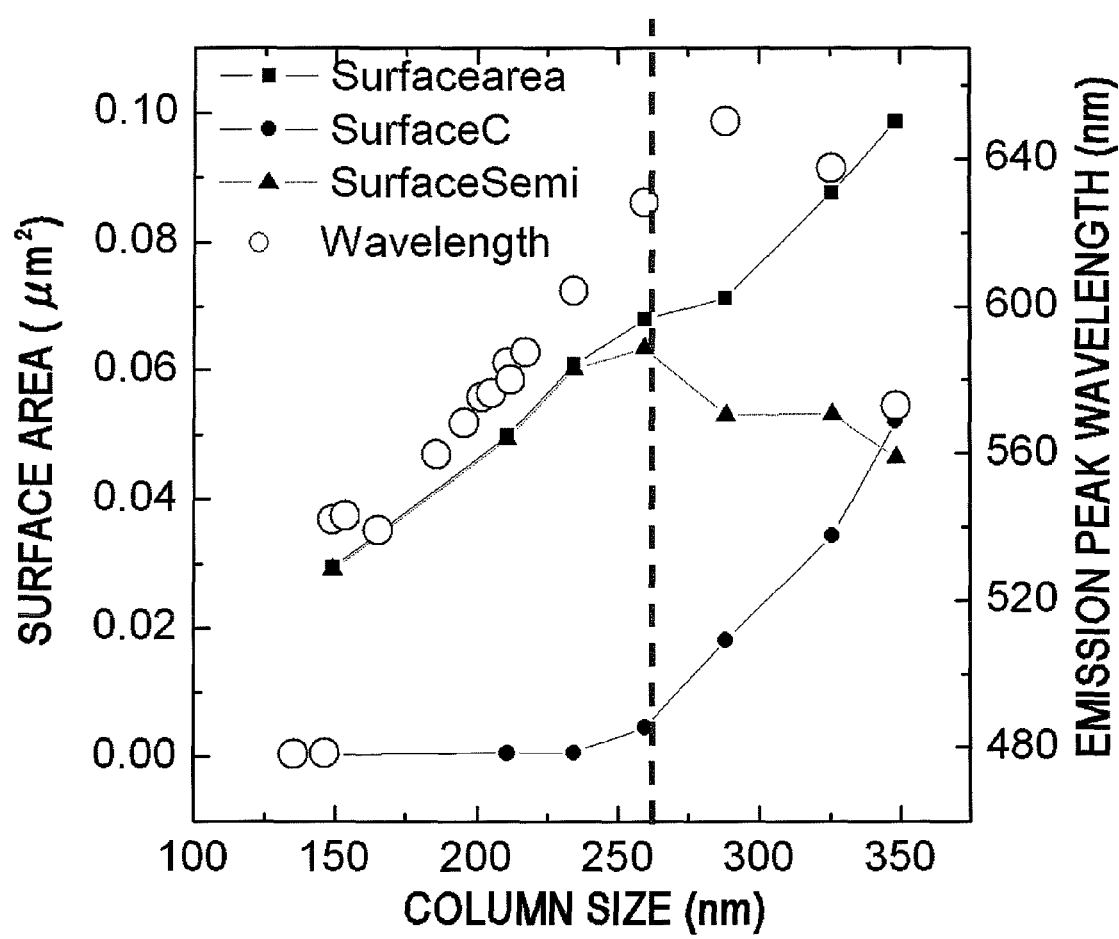
FIG. 16 is a graph illustrating the relationship between the diameter of the nanocolumn and the surface area of the nanocolumn and the relationship between the diameter of the nanocolumn and an emission peak wavelength.

FIG. 16 is a graph illustrating the relationship between the diameter (column size) of the nanocolumn 23 and the surface area of the facet structure of the leading end of the nanocolumn 23 and the relationship between the column size and an emission peak wavelength. The emission peak wavelength means a wavelength detected from the intensity distribution of PL light. In the graph, symbol "○" indicates the measured value of the emission peak wavelength, symbol "●" indicates the area of the flat surface (Surface C) of the leading end of the nanocolumn 23, symbol "▲" indicates the area of the inclined side surface (Surface Semi) of the leading end of the nanocolumn 23, and symbol "■" indicates the sum of the area of the flat surface and the area of the inclined side surface of the leading end of the nanocolumn 23.

The manufacturing conditions of the nanocolumn 23 manufactured in order to obtain the graph shown in FIG. 16 are as follows. The GaN layer 12P (thickness: about 3.5 μm) was grown on the (0001)-plane of the sapphire substrate 11 by the MOCVD method to form a template substrate. A titanium thin film (thickness: about 5 nm) was formed on the template substrate and a plurality of opening portions (spatial period: 400 nm) arranged in a triangle lattice was provided in the titanium thin film by the FIB method, thereby forming the mask pattern 13P. At the same time as the mask opening portions were formed, the concave portions 14 were formed in the GaN layer 12P. Then, the GaN columnar crystals 20 (height: 2.5 μm) were grown from the concave portions 14 of the template substrate through the mask opening portions by the RF-MBE method at a temperature of 900 degrees centigrade. Then, the active layer 21 that had a multiple quantum well structure including an InGaN film (thickness: 1 nm) was formed on each of the fine columnar crystals 20. Then, the GaN crystal semiconductor covering layer 22 (thickness: 10 nm) was formed on the active layer 21.

Under the manufacturing conditions, a plurality of nanocolumn group samples with different column sizes in the range of 135 nm to 350 nm was manufactured. In each of the samples, the surface area of the leading end of the nanocolumn 23 and the emission peak wavelength were manufactured. FIG. 16 is a graph illustrating the measurement result.

As shown in the graph of FIG. 16, the surface area of (the sum of the area of the inclined side surface (facet surface) and the area of the flat surface) of the facet structure of the leading end of the nanocolumn 23 increases with an increase in the column size. In addition, in the column size range of about 135 nm to about 288 nm, the emission peak wavelength monotonously increases with an increase in the column size. Therefore, the emission peak wavelength increases with an increase in the total area of the facet surface facing upward at the leading end of the nanocolumn 23. Since the thickness of the active layer 21 and the thickness of the semiconductor covering layer 22 are small, the emission peak wavelength may increase with an increase in the area of the facet surface facing upward at the leading end of the fine columnar crystal 20. Therefore, it is possible to obtain a desired emission peak wavelength by controlling the area of the facet surface facing upward at the leading end of the fine columnar crystal 20.

As shown in the graph of FIG. 16, in the column size range of about 135 nm to about 260 nm, a positive correlation in which the emission peak wavelength increases with an increase in the area of the inclined side surface (Surface Semi) of the leading end of the nanocolumn 23 is established. However, when the column size is more than about 260 nm, the correlation is not established. Instead of the above, in the column size range of about 260 nm to about 288 nm, the emission peak wavelength increases with an increase in the area of the flat surface (Surface C) of the leading end of the nanocolumn 23.

Figure 17:
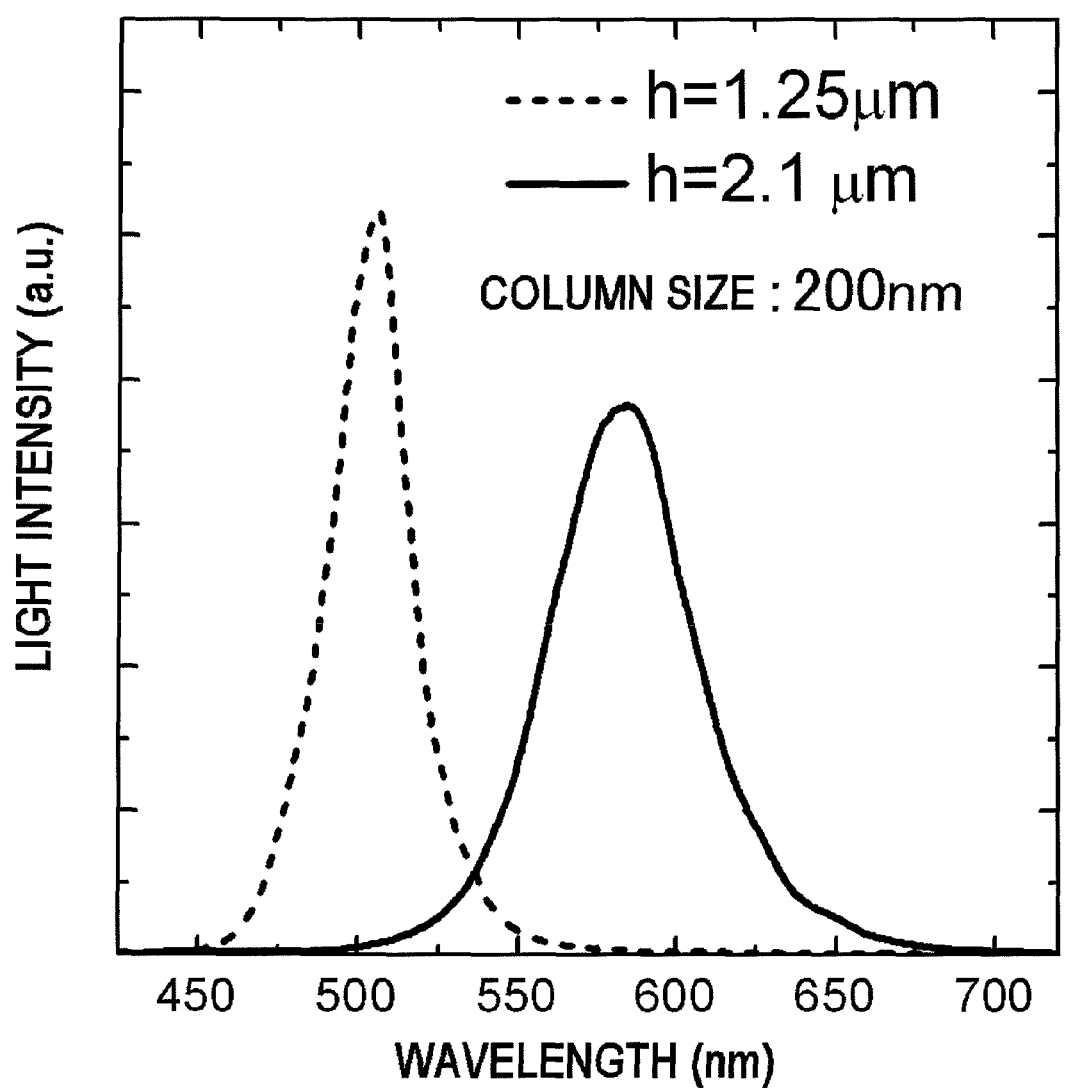
FIG. 17 is a graph illustrating the light intensity distribution of the nanocolumns with respect to a PL emission wavelength.
Figure 18:
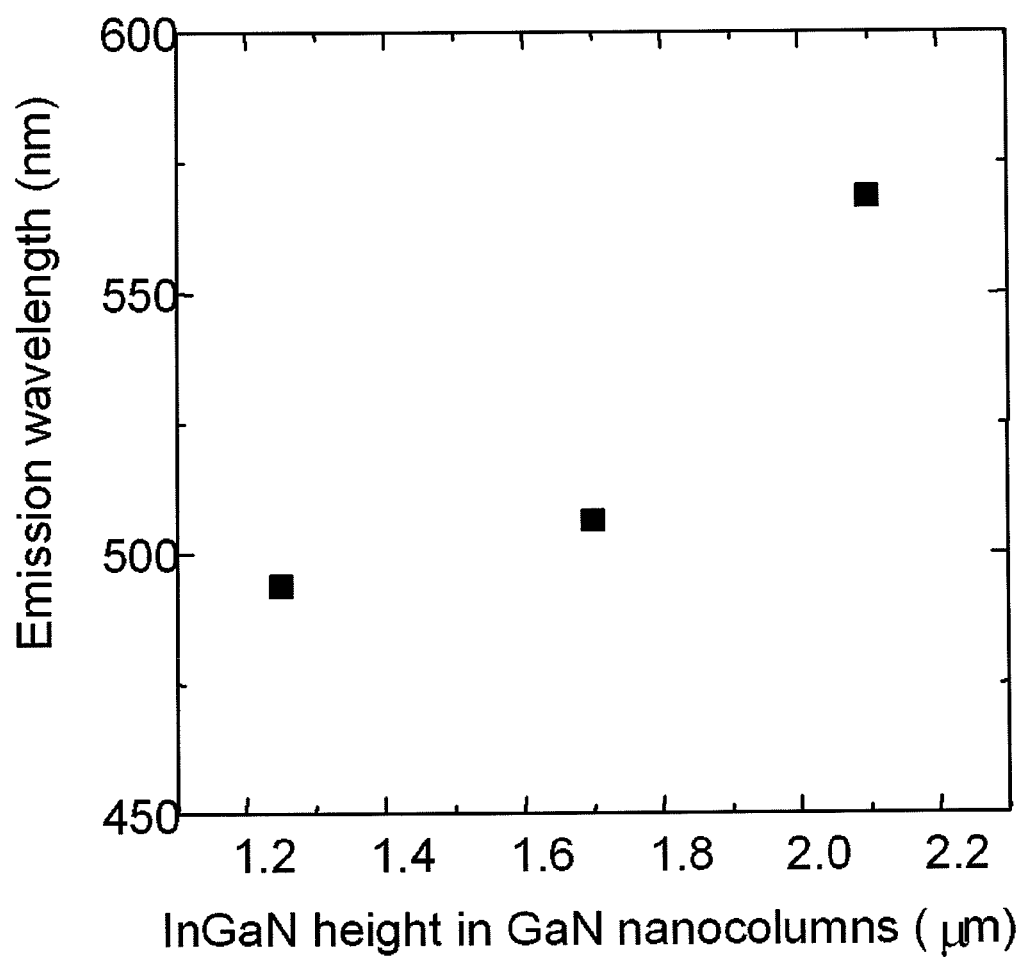
FIG. 18 is a graph illustrating the relationship between the height of the leading end of the nanocolumn and the emission peak wavelength.

FIG. 17 is a graph illustrating the light intensity distribution (unit: arbitrary unit) of the nanocolumn 23 with a column size of 200 nm with respect to the PL emission wavelength. In the graph, a solid line indicates a measured curve when the height of the inclined side surface of the leading end of the nanocolumn 23 is 2.1 µm and a dashed line indicates a measured curve when the height of the inclined side surface of the leading end of the nanocolumn 23 is 1.25 µm. FIG. 18 is a graph illustrating the relationship between the height of the nanocolumn 23 and the emission peak wavelength. In the graph shown in FIG. 18, the horizontal axis corresponds to the height and the vertical axis corresponds to the emission peak wavelength.

The manufacturing conditions of the nanocolumn 23 manufactured in order to obtain the graphs shown in FIGS. 17 and 18 are as follows. The GaN layer 12P (thickness: about 3.5 µm) was grown on the (0001)-plane of the sapphire substrate 11 by the MOCVD method to form a template substrate. A titanium thin film (thickness: about 5 nm) was formed on the template substrate and a plurality of opening portions (spatial period: 400 nm) arranged in a triangle lattice was provided in the titanium thin film by the FIB method, thereby forming the mask pattern 13P. At the same time as the mask opening portions were formed, the concave portions 14 were formed in the GaN layer 12P. Then, the GaN columnar crystals 20 (height: 2.5 µm) were grown from the concave portions 14 of the template substrate through the mask opening portions by the RF-MBE method at a temperature of 900 degrees centigrade. Then, the active layer 21 that had a multiple quantum well structure including an InGaN film (thickness: 1 nm) was formed on each of the fine columnar crystals 20. Then, the GaN crystal semiconductor covering layer 22 (thickness: 10 nm) was formed on the active layer 21.

As shown in FIG. 17, when the height of the inclined side surface of the leading end of the nanocolumn 23 is changed from 1.25 µm to 2.1 µm, the peak of the light intensity distribution also shifts to the long wavelength side. FIG. 18 shows the tendency.

(Dependency of Emission Wavelength on In-Plane Density)

FIGS. 19(A) to 19(F) are diagrams illustrating the SEM images of nanocolumn groups regularly arranged in a triangle lattice, as viewed from the upper side. FIGS. 19(A), 19(B), 19(C), 19(D), 19(E), and 19(F) show the arrangement of the nanocolumns when the spatial period (the distance between the centers of the fine columnar crystals 20) is 400 nm, 600 nm, 800 nm, 1 µm, 2 µm, and 4 µm. The measured peak wavelengths of PL light corresponding to the arrangement of the spatial periods of 400 nm, 600 nm, 800 nm, 1 µm, 2 µm, and 4 µm were 508 nm, 500 nm, 490 nm, 480 nm, 480 nm, and 479 nm.

Figure 19:
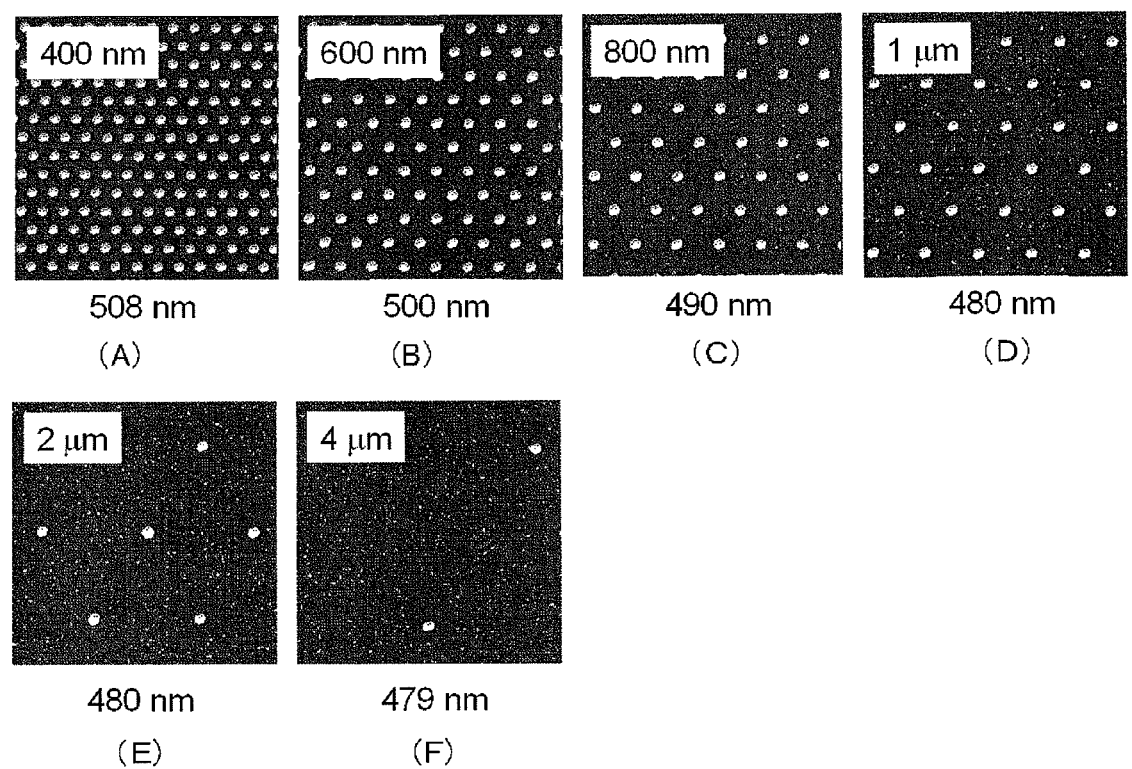
FIG. 19((A) to (F)) is diagrams illustrating the SEM images of nanocolumn groups regularly arranged in a triangle lattice, as viewed from the upper side.

The manufacturing conditions of the nanocolumn 23 manufactured in order to obtain the SEM images shown in FIG. 19 are as follows. The GaN layer 12P (thickness: about 3.5 µm) was grown on the (0001)-plane of the sapphire substrate 11 by the MOCVD method to form a template substrate. A titanium thin film (thickness: about 5 nm) was formed on the template substrate and a plurality of mask opening portions (the diameter of each mask opening portion: 167 nm) arranged in a triangle lattice was provided in the titanium thin film by the FIB method, thereby forming the mask pattern 13P. At the same time as the mask opening portions were formed, the concave portions 14 were formed in the GaN layer 12P. Then, the GaN columnar crystals 20 (height: 1.5 µm and diameter: 190 nm) were grown from the concave portions 14 of the template substrate through the mask opening portions by the RF-MBE method at a temperature of 900 degrees centigrade. Then, the active layer 21 that had a multiple quantum well structure including an InGaN film (thickness: 3 nm) was formed on each of the fine columnar crystals 20. Then, the GaN crystal semiconductor covering layer 22 (thickness: 10 nm) was formed on the active layer 21.

As shown in FIGS. 19(A) to 19(F), the peak wavelength shifts to the long wavelength side as the spatial period (column period and arrangement density) of the nanocolumns 23, . . . , 23 is reduced, and the peak wavelength shifts to the short wavelength side as the spatial period of the nanocolumns 23, . . . , 23 increases.

Figure 20:
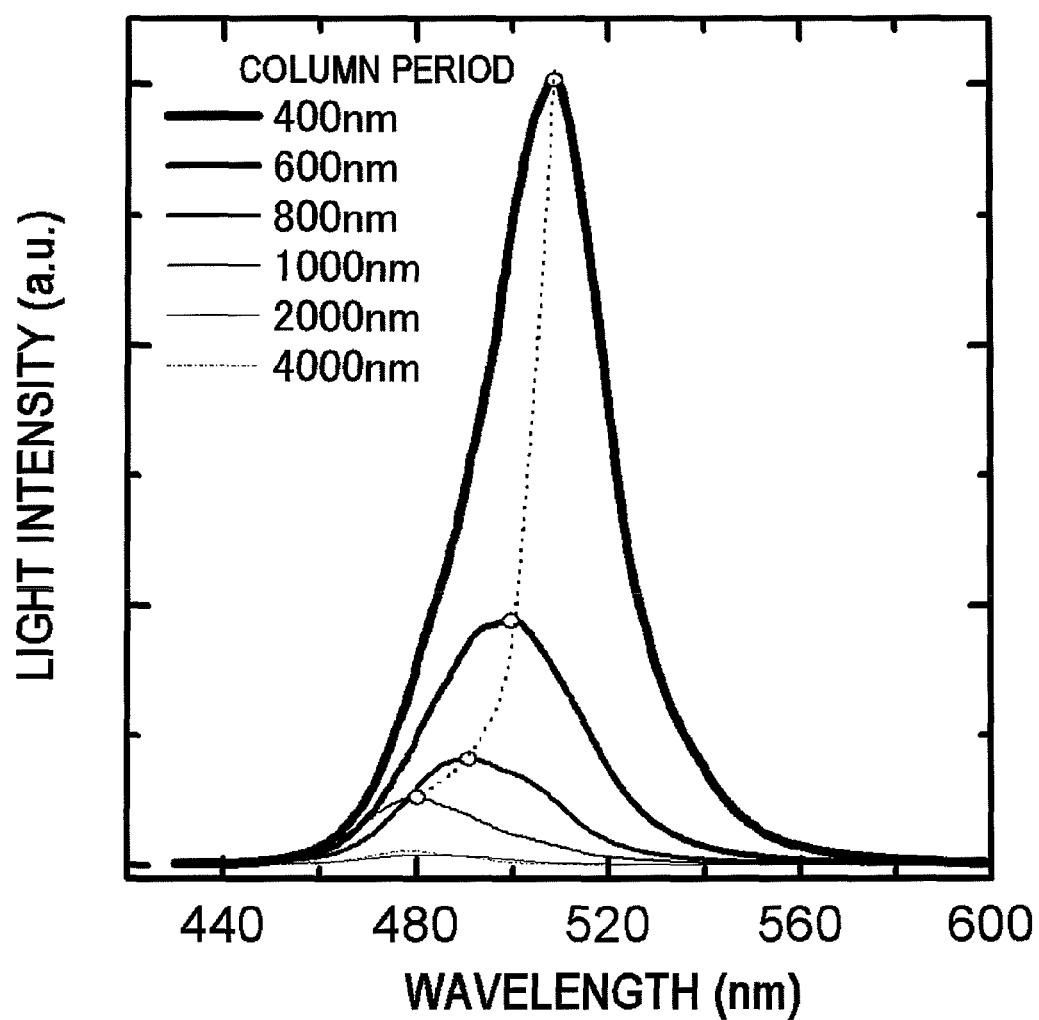
FIG. 20 is a graph illustrating the measurement result of the light intensity distribution of the nanocolumn groups shown in FIG. 19((A) to (F)) with respect to the PL emission wavelength.
Figure 21:
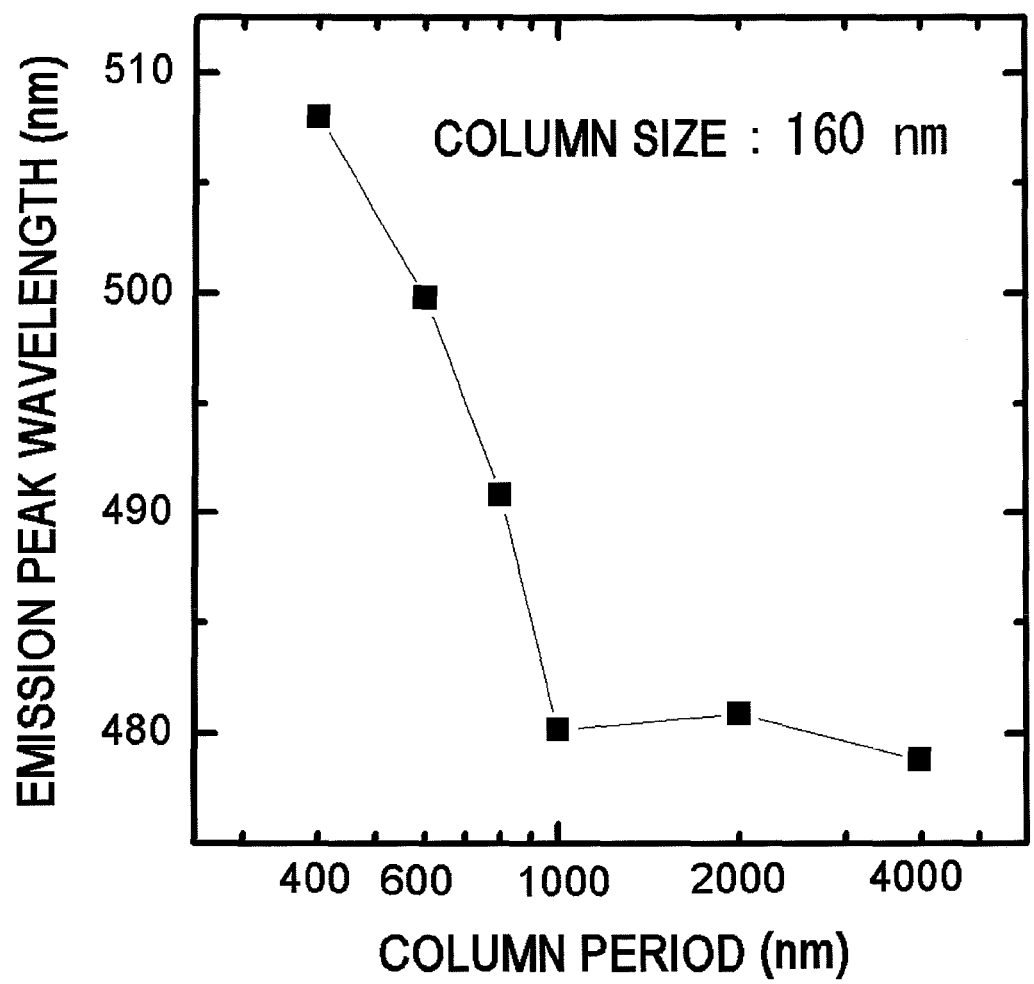
FIG. 21 is a graph illustrating the relationship between a column period and the emission peak wavelength in the light intensity distribution shown in FIG. 20.

FIG. 20 is a graph illustrating the measurement result of the light intensity distribution (unit: arbitrary unit) of the nanocolumn groups shown in FIGS. 19(A) to 19(F) with respect to the PL emission wavelength. FIG. 21 is a graph illustrating the relationship between the column period and the emission peak wavelength of the light intensity distribution shown in FIG. 20. The column size of each nanocolumn 23 was 160 nm.

As shown in FIG. 21, when the column period is equal to or less than about 1 µm, the emission peak wavelength is reduced with an increase in the column period. When the column period increases with the column size maintained at a constant value, the in-plane density of the nanocolumns 23, . . . , 23 is reduced. Therefore, the emission peak wavelength is reduced with the reduction in the in-plane density and increases with an increase in the in-plane density.

Figure 22:
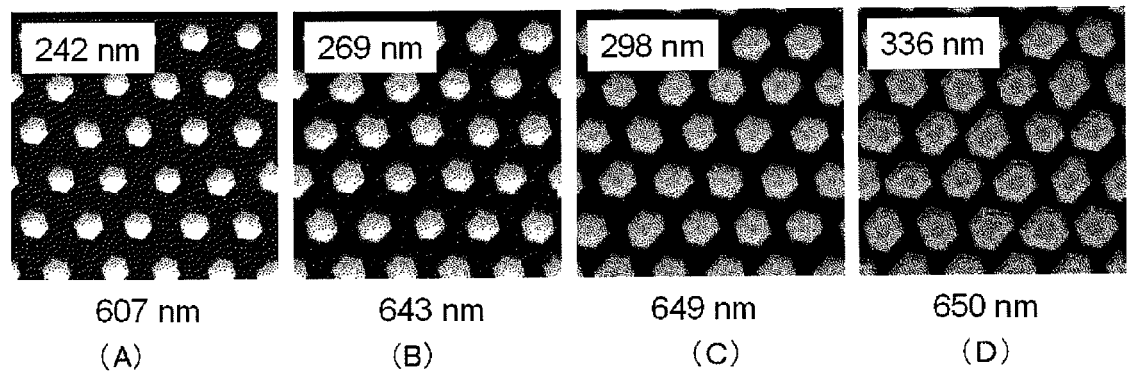
FIG. 22 is a diagram illustrating the SEM images of the nanocolumn groups regularly arranged in a triangle lattice, as viewed from the upper side.

FIG. 22 is a diagram illustrating the SEM images of nanocolumn groups regularly arranged in a triangle lattice, as viewed from the upper side. FIGS. 22(A), 22(B), 22(C), and 22(D) show the arrangement of the nanocolumns when the spatial period is 242 nm, 269 nm, 298 nm, and 336 nm. The measured peak wavelengths of PL light corresponding to the arrangement of the spatial periods of 242 nm, 269 nm, 298 nm, and 336 nm were 607 nm, 643 nm, 649 nm, and 650 nm.

The manufacturing conditions of the nanocolumn 23 manufactured in order to obtain the SEM images shown in FIGS. 22(A) to 22(D) are the same as those of the nanocolumn 23 manufactured in order to obtain the SEM images shown in FIG. 19 except for the diameter of the mask opening portion. The diameter of the nanocolumn 23 manufactured in order to obtain the SEM images shown in FIG. 22 is set so as to increase with an increase in the spatial period.

As shown in FIGS. 22(A) to 22(D), the peak wavelength increases with an increase in the diameter of the nanocolumn 23. The in-plane density (arrangement density) of the nanocolumns 23, . . . , 23 increases with an increase in the diameter of the nanocolumn 23. Therefore, the emission peak wavelength increases with the increase in the in-plane density and the emission peak wavelength is reduced with a reduction in the in-plane density.

Considering that the thickness of the semiconductor covering layer 22 of the nanocolumn 23 is small and crystal growth in the horizontal direction is inhibited, the peak wavelength of light emitted from the active layer 21 shifts to the long wavelength side as the in-plane density of the fine columnar crystals 20, . . . , 20 increases, and shifts to the short wavelength side as the in-plane density of the fine columnar crystals 20, . . . , 20 decreases. Therefore, it is possible to obtain a desired emission wavelength by controlling the diameter of the fine columnar crystal 20.

As described above, in the semiconductor optical element array 10 according to the first embodiment, it is possible to control the position of the fine columnar crystal 20 formed on the template substrate by adjusting the position of the opening portion of the mask pattern 13P. In addition, it is possible to control the diameter of the fine columnar crystal 20 by adjusting the diameter of the concave portion 14 immediately below each opening portion. In this way, it is possible to set the peak wavelength of light emitted from the active layer 21 to a desired value. In addition, it is possible to increase the diameter of each fine columnar crystal 20 to shift the peak wavelength to the long wavelength side, and decrease the diameter of each fine columnar crystal 20 to shift the peak wavelength to the short wavelength side.

It is possible to set the peak wavelength of light emitted from the active layer 21 to a desired value by controlling the surface area of the facet structure of the leading end of the fine columnar crystal 20. It is possible to increase the surface area of the facet structure to shift the peak wavelength to the long wavelength side, and decrease the surface area of the facet structure to shift the peak wavelength to the short wavelength side.

It is possible to increase the in-plane density of the fine columnar crystals 20, . . . , 20 that are periodically arranged to shift the peak wavelength to the long wavelength side and decrease the in-plane density of the fine columnar crystals 20, . . . , 20 to shift the peak wavelength to the short wavelength side. It is possible to control the in-plane density with high accuracy by adjusting the spatial period (that is, the spatial period of the opening portion formed in the mask pattern 13P) of the fine columnar crystals 20, . . . , 20 or by adjusting the diameter (that is, the diameter of the opening portion formed in the mask pattern 13P) of each fine columnar crystal 20.

Second Embodiment

Figure 23:
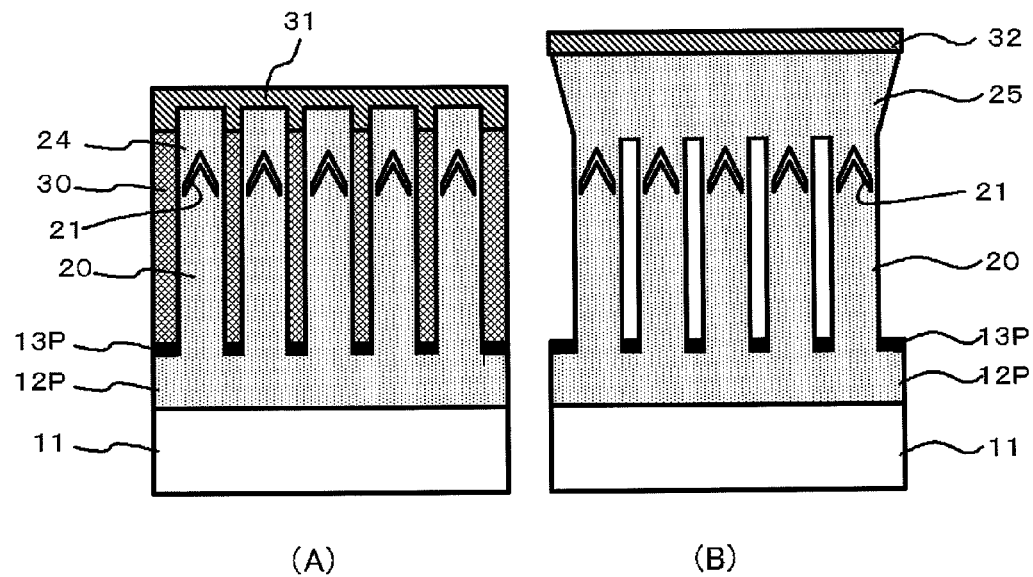
FIGS. 23((A) and (B)) is diagrams schematically illustrating a portion of the structure of a semiconductor light emitting element according to a second embodiment.

Next, a second embodiment of the invention will be described. FIGS. 23(A) and 23(B) are diagrams schematically illustrating a portion of the structure of a semiconductor light emitting element according to the second embodiment. The structure shown in FIGS. 23(A) and 23(B) includes the structure of the semiconductor optical element array 10 according to the first embodiment.

Referring to FIG. 23(A), the group-III nitride semiconductor layer 12P formed on the base substrate 11 is an n-type semiconductor layer doped with n-type impurities. The mask pattern 13P is connected to an n-side electrode (not shown). Nanocolumns each having the fine columnar crystal 20 including an n-type cladding layer, such as an n-type AlGaN layer, the active layer 21, and a p-type semiconductor layer 24 including a p-type cladding layer, such as a p-type AlGaN layer, are formed on the group-III nitride semiconductor layer 12P. An insulating film 30 made of, for example, silicon oxide is buried in a space between the nanocolumns. A Ni/Au multi-layer film or a p-side electrode 31 made of, for example, ITO (Indium Tin Oxide) is formed so as to be electrically connected to the p-type semiconductor layers 24, . . . , 24. Holes injected from the p-side electrode and electrons injected from the n-side electrode are recombined with each other in the active layer 21 and light is emitted from the active layer 21.

The fine columnar crystal 20 is an n-type semiconductor layer and may have, for example, a three-layer structure of GaN/AlGaN/GaN.

Referring to FIG. 23(B), the group-III nitride semiconductor layer 12P formed on the base substrate 11 is an n-type semiconductor layer doped with n-type impurities. The mask pattern 13P is connected to an n-side electrode (not shown). Nanocolumns 23 each having the fine columnar crystal 20 including an n-type cladding layer, such as an n-type AlGaN layer, the active layer 21, and a p-type semiconductor layer 25 including a p-type cladding layer, such as a p-type AlGaN layer, are formed on the group-III nitride semiconductor layer 12P. The p-type semiconductor layer 25 is continuously formed in the horizontal direction by the promotion of crystal growth in the horizontal direction.

For example, a method of injecting Mg, a method of reducing the growth temperature, and a method of adding Al are used in order to promote the growth of the p-type semiconductor layer 25 in the horizontal direction. A p-side electrode 32, such as a Ni/Au multi-layer film or an ITO (Indium Tin Oxide) film, is formed so as to be electrically connected to the p-type semiconductor layer 25. Holes injected from the p-side electrode and electrons injected from the n-side electrode are recombined with each other in the active layer 21, and light is emitted from the active layer 21.

When the structure shown in FIGS. 23(A) and 23(B) is configured by a laser diode, an optical resonator that confines light emitted from the active layer 21 may be provided. For example, multi-layer reflecting mirrors may be provided above and below the active layer 21 and the optical resonator may be formed by the multi-layer reflecting mirrors.

An optical waveguide may be formed in the p-type semiconductor layer 25.

The structure shown in FIG. 23(A) or 23(B) may be changed to a photoelectric conversion element, such as a solar cell. For example, in each nanocolumn 23, a pin structure (light absorption structure) may be formed instead of the active layer 21. In the pin structure, an i-type semiconductor layer may have a quantum dot structure. A plurality of quantum dot layers may be laminated with intermediate layers interposed therebetween to form the i-type semiconductor layer, thereby improving conversion efficiency. As described above, it is possible to make the pin structure suitable for a desired absorption wavelength by controlling the diameter of the fine columnar crystal 20, the in-plane density of the fine columnar crystals 20, . . . , 20, or the shape of the leading end of the fine columnar crystal 20.

Third Embodiment

Figure 24:
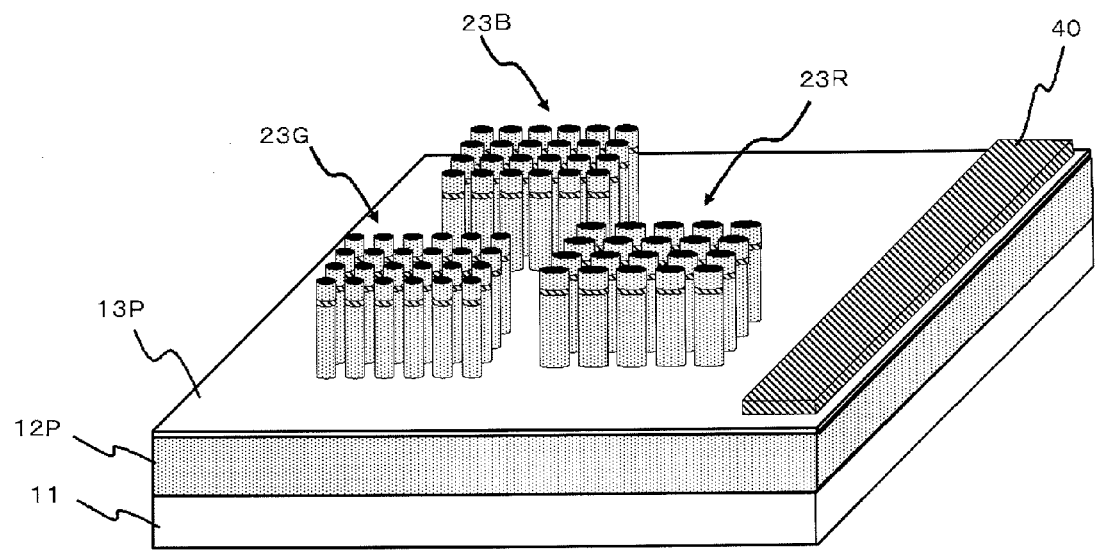
FIG. 24 is a perspective view illustrating a portion of the structure of a semiconductor light emitting element according to a third embodiment of the invention.
Figure 25:
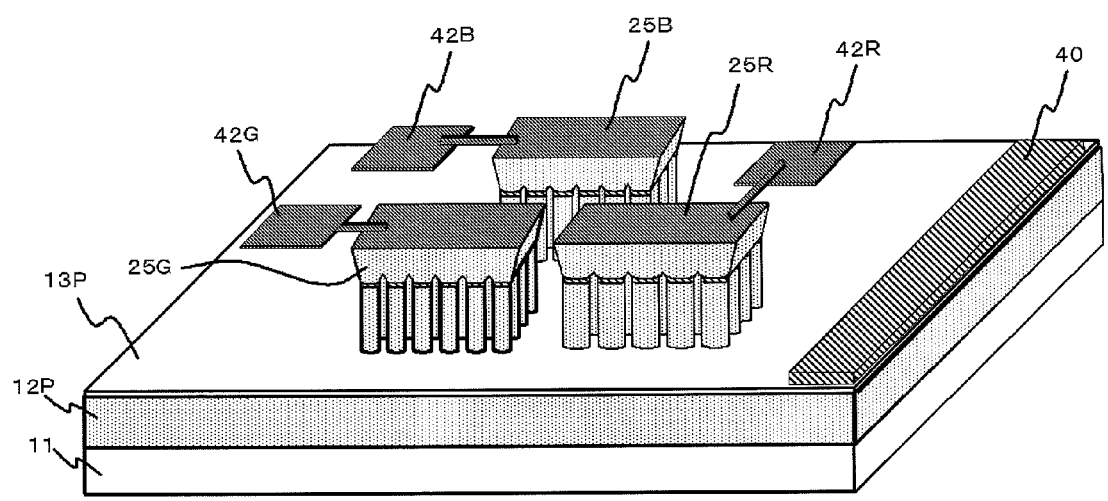
FIG. 25 is a perspective view illustrating a portion of the structure of the semiconductor light emitting element according to the third embodiment of the invention.

Next, a third embodiment of the invention will be described. FIGS. 24 and 25 are perspective views illustrating a portion of a semiconductor light emitting element according to the third embodiment. The semiconductor light emitting element according to the third embodiment includes the structure of the semiconductor optical element array 10 according to the first embodiment.

Referring FIG. 24, the group-III nitride semiconductor layer 12P formed on the base substrate 11 is an n-type semiconductor layer doped with n-type impurities. An n-side electrode 40 is formed on the mask pattern 13P. Plural kinds of nanocolumn groups 23R, 23G, and 23B with different emission wavelengths are formed on the group-III nitride semiconductor layer 12P. Nanocolumns of the nanocolumn groups 23R, 23G, and 23B may have the same structure as the nanocolumn shown in FIG. 23(B) that includes the n-type (first conduction type) fine columnar crystal 20 including an n-type cladding layer, such as an n-type AlGaN layer, the active layer 21, and the p-type (second conduction type) semiconductor layer 25 including a p-type cladding layer, such as a p-type AlGaN layer. The nanocolumn groups 23R, 23G, and 23B have crystal structures that emit light components with the wavelengths of three primary colors, that is, R (red), G (green), and B (blue).

As shown in FIG. 25, p-type semiconductor layers 25R, 25G, and 25B are formed on the nanocolumn groups 23R, 23G, and 23B, respectively. In addition, p-side electrodes 42R, 42G, and 42B are connected to the p-type semiconductor layers 25R, 25G, and 25B, respectively. The p-side electrodes 42R, 42G, and 42B may be a Ni/Au multi-layer film or an ITO (Indium Tin Oxide) film.

Holes injected from the p-side electrodes 42R, 42G, and 42B and electrons injected from the n-side electrode are recombined with each other in the active layers of the nanocolumn groups 23R, 23G, and 23B and the active layer can emit light.

When the structure shown in FIG. 25 is configured by a laser diode, an optical resonator that confines light emitted from the active layer may be provided. For example, multi-layer reflecting mirrors may be provided above and below the active layer and the optical resonator may be formed by the multi-layer reflecting mirrors.

In the semiconductor light emitting element according to the third embodiment, light emitters that emit light components with the wavelengths of the three primary colors may be integrated on the same substrate 11. It is possible to individually adjust the in-plane density of the nanocolumn groups 23R, 23G, and 23B that respectively emit R, G, and B light components to control the light intensity distribution such that the entire spectrum distribution is approximate to the spectrum distribution of sunlight. As a result, it is possible to manufacture an ideal white light emitting diode.

The embodiments of the invention have been described above with reference to the drawings. However, the embodiments of the invention are illustrative, and various structures other the above-mentioned structures ma be used. For example, in the above-described embodiments, the sapphire substrate is used as the base substrate 11, but the invention is not limited thereto. For example, a silicon substrate or a SiC substrate may be used. A group-III nitride semiconductor substrate, such as a gallium nitride substrate, may be used instead of the template substrate.

The semiconductor optical element array according to the invention can be applied to the field of electron devices and optical devices. The nanocolumn has good light-emitting characteristics and the application of the nanocolumn to a light-emitting device is expected. The semiconductor optical element array according to the invention can be applied to, for example, phosphors, light emitting diodes, laser diodes, or photoelectric conversion elements.

The invention claimed is:

1. A semiconductor optical element array comprising:
a semiconductor substrate having a main surface in which a plurality of concave portions is formed;
a mask pattern that is formed on said main surface of said semiconductor substrate and includes a plurality of opening portions provided immediately above said plurality of concave portions;
a plurality of fine columnar crystals that is made of a group-III nitride semiconductor grown from said plurality of concave portions to an upper side of said mask pattern through said plurality of opening portions;
an active layer or a light absorbing layer that is grown on each of said plurality of fine columnar crystals; and
a semiconductor layer covering each of said active layers or said light absorbing layers,
wherein each of said plurality of fine columnar crystals is grown in a vertical direction perpendicular to a plane of said main surface of said semiconductor substrate such that a length of each of said plurality of fine columnar crystals in the vertical direction is greater than a maximum diameter of each of said plurality of fine columnar crystals parallel to said plane of said main surface of said semiconductor substrate, and
wherein a bottom portion and side walls of each of said plurality of concave portions are made of a group-III nitride semiconductor.

2. The semiconductor optical element array according to claim 1,
wherein said active layer is formed on each of said fine columnar crystals.

3. The semiconductor optical element array according to claim 2,
wherein the diameter of each of said fine columnar crystals is equal to or more than 10 nm and equal to or less than 1000 nm.

4. The semiconductor optical element array according to claim 2,
wherein said fine columnar crystals have different diameters,
a peak wavelength of light emitted from said active layer on said fine columnar crystal with a small diameter is lower than that of light emitted from said active layer on said fine columnar crystal with a large diameter.

5. The semiconductor optical element array according to claim 2,
wherein said mask pattern includes a region in which the arrangement density of said plurality of opening portions is high and a region in which the arrangement density of said plurality of opening portions is low, and
the peak wavelength of light emitted from said active layer on a plurality of fine columnar crystals in said region in which the arrangement density of said plurality of opening portions is high is longer than that of light emitted from said active layer on a plurality of fine columnar crystals in said region in which the arrangement density of said plurality of opening portions is low.

6. The semiconductor optical element array according to claim 2,
wherein each of said fine columnar crystals has a facet structure at the leading end, and said facet structures of said fine columnar crystals have different surface areas, and
the peak wavelength of light emitted from said fine columnar crystal having said facet structure with a small surface area is lower than that of light emitted from said fine columnar crystal having said facet structure with a large surface area.

7. The semiconductor optical element array according to claim 6,
wherein each of said fine columnar crystals has a wurtzite-type crystal structure, and
a facet surface of said facet structure includes a semipolar plane of said wurtzite-type crystal structure.

8. The semiconductor optical element array according to claim 7,
wherein said facet structure includes a polar plane of said wurtzite-type crystal structure.

9. The semiconductor optical element array according to claim 6,
wherein each of said fine columnar crystals has a wurtzite-type crystal structure, and
said facet structure includes a polar plane of said wurtzite-type crystal structure.

10. The semiconductor optical element array according to claim 6,
wherein said mask pattern includes a region in which the arrangement density of said plurality of opening portions is high and a region in which the arrangement density of said plurality of opening portions is low, and
the peak wavelength of light emitted from said active layer on a plurality of fine columnar crystals in said region in which the arrangement density of said plurality of opening portions is high is longer than that of light emitted from said active layer on a plurality of fine columnar crystals in said region in which the arrangement density of said plurality of opening portions is low.

11. The semiconductor optical element array according to claim 2,
wherein said active layer is completely covered with said semiconductor layer.

12. The semiconductor optical element array according to claim 2,
wherein said fine columnar crystal is a first conduction type, and
said semiconductor layer includes a group-III nitride semiconductor layer of a second conduction type opposite to said first conduction type.

13. The semiconductor optical element array according to claim 2,
wherein said plurality of fine columnar crystals is classified into a plurality of columnar crystal groups with different emission wavelengths.

14. The semiconductor optical element array according to claim 13,
wherein said plurality of columnar crystal groups includes at least three columnar crystal groups that emit light components with the wavelengths of three primary colors.

15. The semiconductor optical element array according to claim 2,
wherein said active layer has a quantum well structure including a quantum well layer and barrier layers that have a band gap larger than that of said quantum well layer and have said quantum well layer interposed therebetween.

16. The semiconductor optical element array according to claim 2,
wherein said mask pattern is made of one or two or more kinds of metal materials selected from the group consisting of titanium (Ti), tantalum (Ta), iron (Fe), nickel (Ni), platinum (Pt), gold (Au), cobalt (Co), tungsten (W), and molybdenum (Mo).

17. The semiconductor optical element array according to claim 2,
wherein each of said plurality of fine columnar crystals is made of a group-III nitride semiconductor including a gallium nitride.

18. The semiconductor optical element array according to claim 2,
wherein each of said plurality of fine columnar crystals is made of a group-III nitride semiconductor including $Al_xGa_yIn_{1-x-y}N$ ($0 \leq x \leq 1$, $0 \leq y \leq 1$, and $0 \leq x+y \leq 1$).

19. The semiconductor optical element array according to claim 2,
wherein said fine columnar crystals have different diameters,
said mask pattern includes a region in which the arrangement density of said plurality of opening portions is high and a region in which the arrangement density of said plurality of opening portions is low,
a peak wavelength of light emitted from said active layer on said fine columnar crystal with a small diameter is lower than that of light emitted from said active layer on said fine columnar crystal with a large diameter, and
the peak wavelength of light emitted from said active layer on a plurality of fine columnar crystals in said region in which the arrangement density of said plurality of opening portions is high is longer than that of light emitted from said active layer on a plurality of fine columnar crystals in said region in which the arrangement density of said plurality of opening portions is low.

20. The semiconductor optical element array according to claim 19,
the diameters of said fine columnar crystals in the region in which the arrangement density of said plurality of opening portions is high is longer than the diameters of said fine columnar crystals in said region in which the arrangement density of said plurality of opening portion is low.

21. The semiconductor optical element array according to claim 5,
the distance between the centers of the opening portions in the region in which the arrangement density of said plurality of opening portions is high is shorter than the distance between the centers of the opening portions in said region in which the arrangement density of said plurality of opening portion is low.

* * * * *